United States Patent
Song et al.

(10) Patent No.: US 8,953,639 B2
(45) Date of Patent: *Feb. 10, 2015

(54) METHOD AND APPARATUS OF PROCESSING DIGITAL BROADCASTING SIGNAL INCLUDING TRANSMISSION ENSEMBLE NUMBER FIELDS IN TRANSMITTER AND RECEIVER

(71) Applicant: LG Electronics Inc., Seoul (KR)

(72) Inventors: Jae Hyung Song, Seoul (KR); Byoung Gill Kim, Seoul (KR); Jin Woo Kim, Seoul (KR); Won Gyu Song, Seoul (KR); Hyoung Gon Lee, Seoul (KR); In Hwan Choi, Seoul (KR); Chul Kyu Mun, Seoul (KR)

(73) Assignee: LG Electronics Inc., Seoul (KR)

( * ) Notice: Subject to any disclaimer, the term of this patent is extended or adjusted under 35 U.S.C. 154(b) by 53 days.

This patent is subject to a terminal disclaimer.

(21) Appl. No.: 13/765,604

(22) Filed: Feb. 12, 2013

(65) Prior Publication Data

US 2013/0301494 A1 Nov. 14, 2013

Related U.S. Application Data

(63) Continuation of application No. 12/886,284, filed on Sep. 20, 2010, now Pat. No. 8,391,314.

(60) Provisional application No. 61/244,436, filed on Sep. 21, 2009.

(51) Int. Cl.
*H04J 3/22* (2006.01)
*H04N 11/02* (2006.01)
*G06F 15/16* (2006.01)
*H04W 24/02* (2009.01)
*H04W 28/06* (2009.01)
(Continued)

(52) U.S. Cl.
CPC .......... *H04W 24/02* (2013.01); *H04L 1/0056* (2013.01); *H04L 1/0075* (2013.01); *G11B 2020/184* (2013.01); *H03M 13/2924* (2013.01); *H04W 28/06* (2013.01); *H04L 1/0059* (2013.01); *H04L 1/0065* (2013.01); *H04L 1/0072* (2013.01); *H04L 25/03171* (2013.01); *H04L 25/03203* (2013.01); *H04L 27/02* (2013.01); *H04L 2025/03382* (2013.01)
USPC .......... 370/468; 370/470; 370/471; 370/473; 375/240.26; 709/236

(58) Field of Classification Search
None
See application file for complete search history.

(56) References Cited

U.S. PATENT DOCUMENTS 8,019,818 B2 9/2011 Lorch et al.
8,391,314 B2 * 3/2013 Song et al. .............. 370/468
(Continued)

*Primary Examiner* — Timothy J Weidner
(74) *Attorney, Agent, or Firm* — Lee, Hong, Degerman, Kang & Waimey

(57) ABSTRACT

According to one embodiment, a method of processing a digital broadcasting signal in a transmitter includes: performing RS (Reed-Solomon) encoding on signaling data containing cross layer information between a physical layer and a upper layer; interleaving the RS encoded signaling data, wherein interleaving the RS encoded signaling data includes writing the RS encoded signaling data row-by-row from left-to-right and top-to-bottom in a signaling data block, and outputting the signaling data in the signaling data block by reading column-by-column from top-to-bottom and left-to-right; and transmitting the digital broadcasting signal including the mobile service data and the interleaved signaling data during slots.

10 Claims, 27 Drawing Sheets

(51) Int. Cl.
  *H04L 25/03* (2006.01)
  *H04L 27/02* (2006.01)
  *H04L 1/00* (2006.01)
  *G11B 20/18* (2006.01)
  *H03M 13/29* (2006.01)

(56) References Cited

U.S. PATENT DOCUMENTS

| | | | |
|---|---|---|---|
| 2005/0220110 A1* | 10/2005 | Agarwal | 370/392 |
| 2006/0015801 A1* | 1/2006 | Suh et al. | 714/804 |
| 2009/0028079 A1* | 1/2009 | Song et al. | 370/310 |
| 2009/0067336 A1* | 3/2009 | Cho et al. | 370/238 |
| 2009/0129509 A1* | 5/2009 | Choi et al. | 375/326 |
| 2010/0100793 A1 | 4/2010 | Limberg | |
| 2010/0195766 A1 | 8/2010 | Song et al. | |
| 2010/0232550 A1* | 9/2010 | Lee et al. | 375/341 |
| 2010/0296424 A1 | 11/2010 | Kwon et al. | |
| 2011/0149828 A1 | 6/2011 | Song et al. | |
| 2011/0150001 A1 | 6/2011 | Song et al. | |
| 2011/0286546 A1 | 11/2011 | Song et al. | |
| 2012/0063407 A1 | 3/2012 | Park et al. | |
| 2012/0236922 A1* | 9/2012 | Jeong et al. | 375/232 |
| 2014/0149829 A1* | 5/2014 | Lee et al. | 714/776 |

\* cited by examiner

FIG. 3
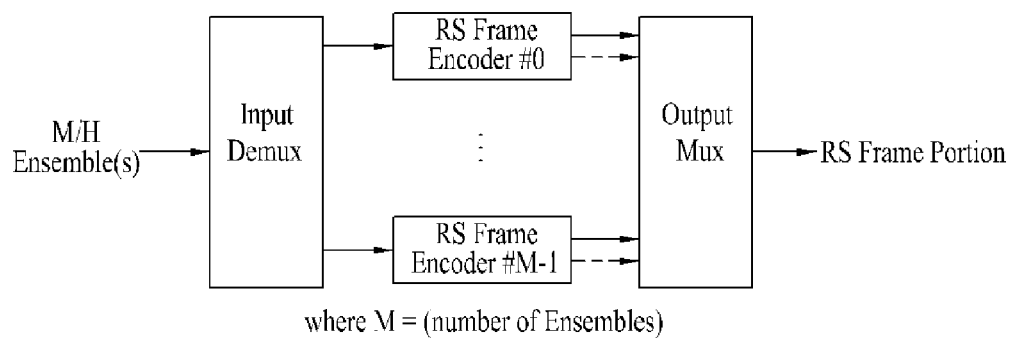
(a)
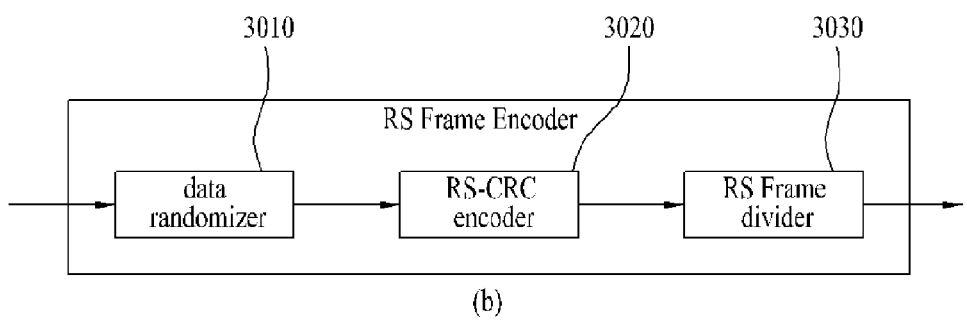
(b)

FIG. 5
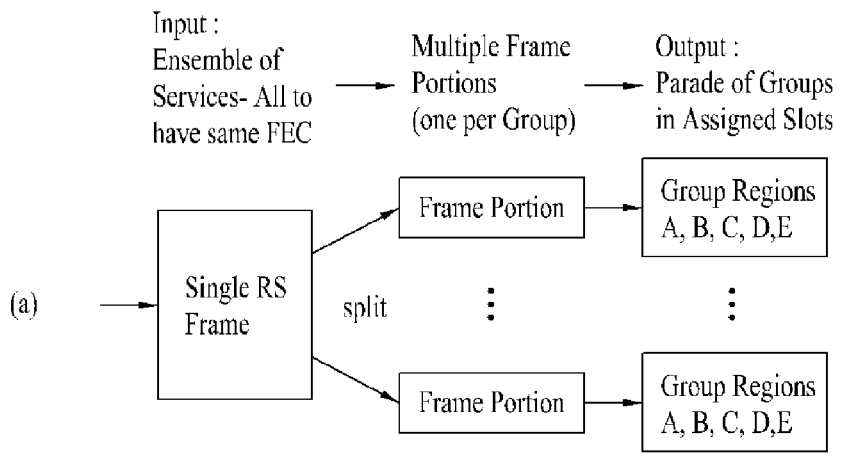
(a)
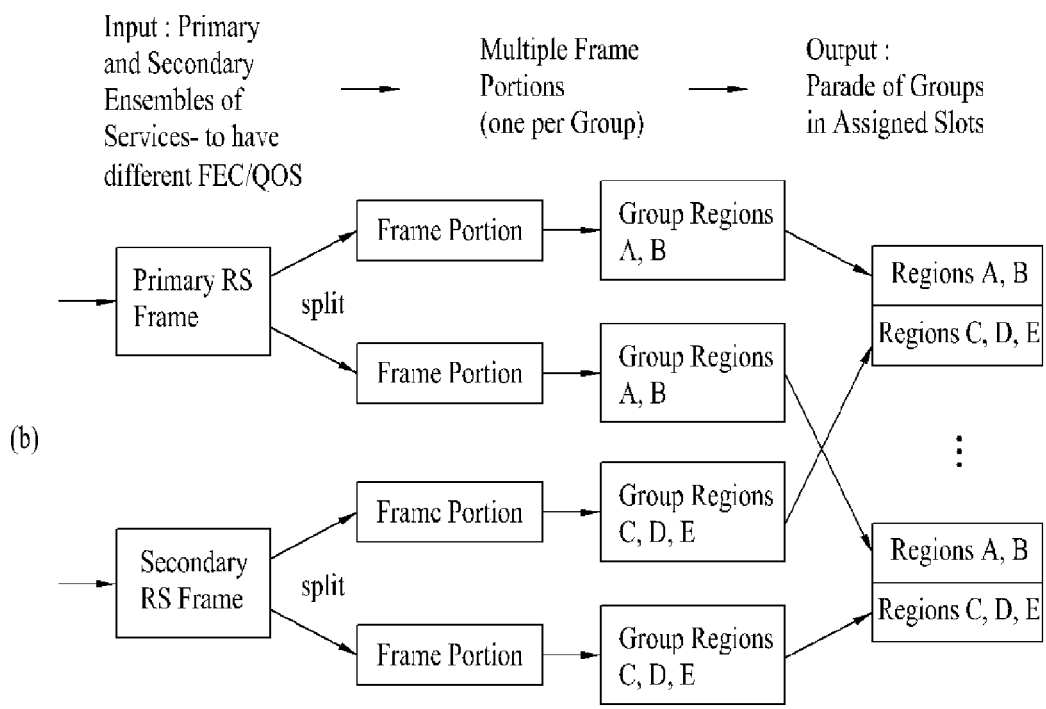
(b)

FIG. 15

| Parade Type | Group Region for the RS Frame | | RS Frame Mode | Region 'E' Indicator | Full Channel Indicator |
|---|---|---|---|---|---|
| | Primary | Secondary | | | |
| 1 | A, B, C, D | - | 00 | 0 | 0 |
| 2 | A, B | C, D | 01 | 0 | 0 |
| 3 | A, B, C, D | E | 00 | 1 | 0 |
| 4 | A, B | C, D, E | 01 | 1 | 0 |
| 5 | A, B, C, D, E | - | 10 | 1 | 0 |
| 6 | A, B, C, D | E | 00 | 1 | 1 |
| 7 | A, B | C, D, E | 01 | 1 | 1 |
| 8 | A, B, C, D, E | | 10 | 1 | 1 |

FIG. 19

| Syntax | No. of Bits | Format |
|---|---|---|
| FIC_chunk_header() { | | |
|    FIC_major_protocol_version | 2 | uimsbf |
|    FIC_minor_protocol_version | 3 | '001' |
|    FIC_chunk_header_extension_length | 3 | '001' |
|    ensemble_loop_header_extension_length | 3 | uimsbf |
|    MH_service_loop_extension_length | 3 | uimsbf |
|    reserved | 1 | '1' |
|    current_next_indicator | 1 | bsblf |
|    transport_stream_id | 16 | uimsbf |
|    num_MH_1.1_ensembles | 8 | uimsbf |
|    num_ensembles | 8 | uimsbf |
| } | | |

FIG. 20

| Syntax | No. of Bits | Format |
|---|---|---|
| FIC_chunk_payload() { | | |
|   for (i=0; i<num_ensembles; i++) { | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for(j=0;j<num_MH_services;j++)} | | |
|       MH_service_id | 16 | uimsbf |
|       reserved | 3 | '111' |
|       service_span | 2 | uimsbf |
|       MH_service_status | 2 | uimsbf |
|       SP_indicator | 1 | bslbf |
|     } | | |
|   } | | |
|   for (i=0; i<num_MH_1.1_ensembles; i++) { | | |
|     ensemble_id | 8 | uimsbf |
|     reserved | 3 | '111' |
|     ensemble_protocol_version | 3 | '111' |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++) { | | |
|       MH_service_id | 16 | uimsbf |
|       reserved | 3 | '111' |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing() | Var | |

FIG. 22

| Syntax | No. of Bits | Format |
|---|---|---|
| FIC_segment_header() { | | |
|    FIC_segment_type | 2 | uimsbf |
|    reserved | 2 | '11' |
|    FIC_chunk_major_protocol_version | 2 | uimsbf |
|    current_next_indicator | 1 | bslbf |
|    error_indicator | 1 | bslbf |
|    FIC_segment_num | 4 | uimsbf |
|    FIC_last_segment_num | 4 | uimsbf |
| } | | |

METHOD AND APPARATUS OF PROCESSING DIGITAL BROADCASTING SIGNAL INCLUDING TRANSMISSION ENSEMBLE NUMBER FIELDS IN TRANSMITTER AND RECEIVER

CROSS-REFERENCE TO RELATED APPLICATIONS

This application is a continuation of U.S. application Ser. No. 12/886,284, filed on Sep. 20, 2010, now U.S. Pat. No. 8,391,314, which claims the benefit of U.S. Provisional Application No. 61/244,436, filed on Sep. 21, 2009, the contents of which are hereby incorporated by reference herein in their entirety.

BACKGROUND OF THE INVENTION

1. The Field of the Invention

The present invention relates to a digital broadcasting system for processing the digital broadcasting signal in transmitter and receiver, and more particularly, to a transmitting system and a method for processing and transmitting the digital broadcast signal, and a receiving system and a method for processing the digital broadcast signal in the receiving system.

2. Description of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a transmitting system and a method of processing a digital broadcast signal in a transmitting system that substantially obviate one or more problems due to limitations and disadvantages of the related art.

An object of the present invention is to provide a transmission system which is able to transmit additional mobile service data while simultaneously maintaining the compatibility with a conventional system for transmitting a digital broadcast signal, and a method for processing a broadcast signal.

Another object of the present invention is to provide a method of transmitting mobile services that can flexibly respond to changes in a mobile broadcasting system, by processing a partial region of a data group so as to be compatible with the conventional mobile broadcasting system, or by processing the entire region of a data group so as to be used for a new mobile broadcasting system.

Another object of the present invention is to provide a transmission system which generates information of additional mobile service data by extending signaling information and transmits the generated information to a reception system, such that the transmission system and the reception end can smoothly communicate with each other, and a method for processing a broadcast signal.

Another object of the present invention is to provide an extended signaling data structure for a Scalable Full Channel Mobile Mode (SFCMM).

Another object of the present invention is to provide a method for allowing both an SFCMM receiver and a Core Mobile Mode (CMM) receiver to process extended signaling data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of processing a digital broadcasting signal in a transmitter includes performing RS (Reed-Solomon) encoding on signaling data containing cross layer information between a physical layer and a upper layer, wherein the signaling data includes a first field indicating a protocol version change of the signaling data, a second field indicating a length of an extension field of a header included in the signaling data, and at least one field indicating a number of ensembles for at least one of a first transmission mode and a second transmission mode, and wherein the ensembles include a collection of services, each of the services being a package of packetized streams of mobile service data, forming data groups including the signaling data and the mobile service data, forming mobile service data packets including the signaling data and the mobile service data in the data groups, transmitting the digital broadcasting signal including the mobile service data packets during slots, wherein the first transmission mode is a mode in which the mobile service data are transmitted while reserving greater than 118 packets out of 156 packets in the slot and the second transmission mode is a mode in which the mobile service data are transmitted while reserving less than or equal to 118 packets out of 156 packets in the slot.

When the first field represents a protocol version change of the signaling data, the second field represents the length of an extension field of a header intended for the first transmission mode.

The signaling data includes a third field indicating a number of ensembles of the first transmission mode.

The signaling data includes the header and a payload, and the payload includes a number of ensemble information according to the number of ensembles of the first transmission mode.

A transmitter for processing a digital broadcasting signal includes an encoder performing RS (Reed-Solomon) encoding on signaling data containing cross layer information between a physical layer and a upper layer, wherein the signaling data includes a first field indicating a protocol version change of the signaling data, a second field indicating a length of an extension field of a header included in the signaling data, and at least one field indicating a number of ensembles for at least one of a first transmission mode and a second transmission mode, and wherein the ensembles include a collection of services, each of the services being a package of packetized streams of mobile service data, a group formatter forming data groups including the signaling data and the mobile service data, a packet formatter forming mobile service data packets including the signaling data and the mobile service data in the data groups, a transmission unit transmitting the digital broadcasting signal including the mobile service data packets during slots, wherein the first transmission mode is a mode in which the mobile service data are transmitted while reserving greater than 118 packets out of 156 packets in the slot and the second transmission mode is a mode in which the mobile service data are transmitted while reserving less than or equal to 118 packets out of 156 packets in the slot.

A method of processing a digital broadcasting signal in a receiver includes receiving a digital broadcasting signal including data groups during slots, wherein the data groups including signaling data and mobile service data, wherein the signaling data contains cross layer information between a physical layer and a upper layer, wherein the signaling data includes a first field indicating a protocol version change of the signaling data, a second field indicating a length of an extension field of a header included in the signaling data, and at least one field indicating a number of ensembles for at least one of a first transmission mode and a second transmission mode, and wherein the ensembles include a collection of services, each of the services being a package of packetized streams of mobile service data, demodulating the broadcasting signal, decoding the signaling data from the demodulated broadcasting signal, wherein the first transmission mode is a mode in which the mobile service data are transmitted while reserving greater than 118 packets out of 156 packets in the slot and the second transmission mode is a mode in which the mobile service data are transmitted while reserving less than or equal to 118 packets out of 156 packets in the slot.

The first field represents a protocol version change of the signaling data, the second field represents the length of an extension field of a header intended for the first transmission mode.

The signaling data includes a third field indicating a number of ensembles of the first transmission mode.

The signaling data includes the header and a payload, and the payload includes a number of ensemble information according to the number of ensembles of the first transmission mode.

The receiver processes a third field indicating a number of ensembles of the first transmission mode included in the signaling data when the second field represents the length of an extension field of a header intended for the first transmission mode.

A receiver for processing a digital broadcasting signal includes a receiving unit receiving a digital broadcasting signal including data groups during slots, wherein the data groups including signaling data and mobile service data, wherein the signaling data contains cross layer information between a physical layer and a upper layer, wherein the signaling data includes a first field indicating a protocol version change of the signaling data, a second field indicating a length of an extension field of a header included in the signaling data, and at least one field indicating a number of ensembles for at least one of a first transmission mode and a second transmission mode, and wherein the ensembles include a collection of services, each of the services being a package of packetized streams of mobile service data, a demodulator demodulating the broadcasting signal, a decoder decoding the signaling data from the demodulated broadcasting signal, wherein the first transmission mode is a mode in which the mobile service data are transmitted while reserving greater than 118 packets out of 156 packets in the slot and the second transmission mode is a mode in which the mobile service data are transmitted while reserving less than or equal to 118 packets out of 156 packets in the slot.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 illustrates a data frame encoder according to an embodiment of the present invention.

FIG. 5 illustrate a process of one or two RS frame being divided into several portions, based upon an RS frame mode value, and a process of each portion being assigned to a corresponding region within the respective data group.

FIG. 15 illustrates a method for transmitting a primary or secondary ensemble/RS frame through an A, B, C, D, or E region in a data group according to an embodiment of the present invention.

FIG. 19 illustrates a syntax structure of an FIC chunk header according to an embodiment of the present invention.

FIG. 20 illustrates an exemplary syntax structure of an FIC chunk payload according to an embodiment of the present invention.

FIG. 22 illustrates an exemplary syntax structure of an FIC segment header according to an embodiment of the present invention.

DESCRIPTION OF THE PREFERRED EMBODIMENTS

Figure 1:
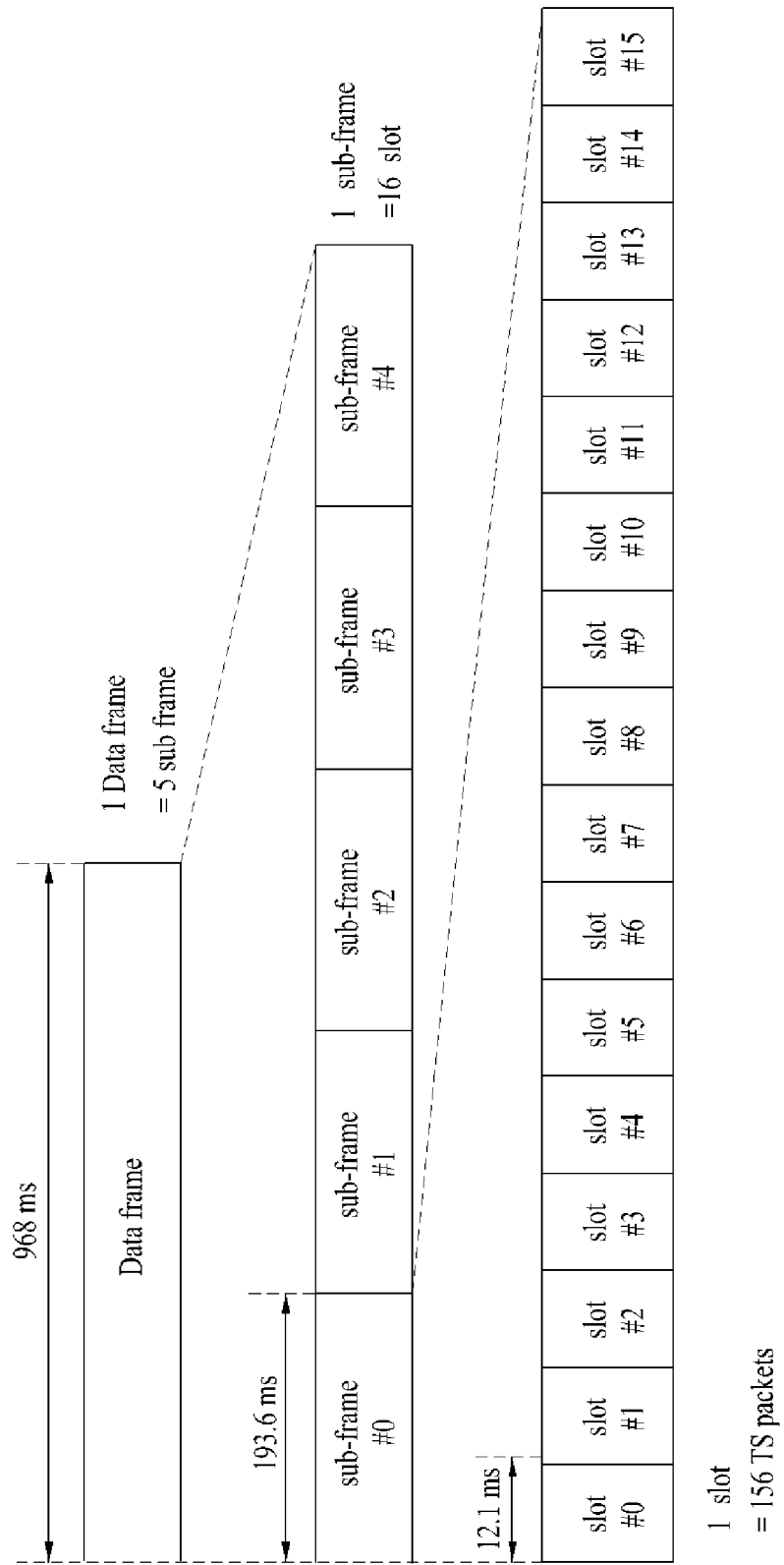
FIG. 1 illustrates a data frame (M/H frame) structure for transmitting/receiving mobile service data according to one embodiment of the present invention.

Reference will now be made in detail to the preferred embodiments of the present invention, examples of which are illustrated in the accompanying drawings. Wherever possible, the same reference numbers will be used throughout the drawings to refer to the same or like parts.

In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

For convenience of description and better understanding of the present invention, abbreviations and terms to be use in the present invention are defined as follows.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "M/H (or MH)" corresponds to the initials of "mobile" and "handheld" and represents the opposite concept of a fixed-type system. Furthermore, the M/H service data may include at least one of mobile service data and handheld service data, and will also be referred to as "mobile service data" for simplicity. Herein, the mobile service data not only correspond to M/H service data but may also include any type of service data with mobile or portable characteristics. Therefore, the mobile service data according to the present invention are not limited only to the M/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

Additionally, in the embodiment of the present invention, a group (also referred to as an M/H group or a data group) corresponds to a collection (or group) of data packets confined within a slot (also referred to as an M/H slot).

A group division refers to a set of group regions within a slot. Herein, a group division is categorized into a Primary Group Division or a Secondary Group Division. At this point, a collection of primary group divisions within an M/H frame configures (or forms) a primary parade, whereas a collection of secondary group divisions configures (or forms) a secondary parade or an overlay parade.

A group type is determined by the configuration of a group division within a single group.

A parade (also referred to as an M/H parade) refers to a collection of groups that have the same FEC parameters. More specifically, a parade refers to a collection of group divisions of groups having the same group type.

A primary parade (also referred to as a primary M/H parade) corresponds to a collection of primary group divisions, and a secondary parade (also referred to as a secondary M/H parade) corresponds to a collection of secondary group divisions. Each of the secondary group divisions is carried (or transported) through the same slot with its respectively paired primary group division. The secondary parade has the same parade identifier (ID) as its respective primary parade (i.e., the secondary parade shares the same parade ID with its respective primary parade)

An overlay parade (also referred to as an overlay M/H parade) corresponds to a collection of secondary group divisions. And, in this case, the secondary group divisions are not paired with any of the primary group divisions.

An RS frame corresponds to a two (2)-dimensional (2D) data frame, wherein an RS frame payload is RS-CRC encoded.

In a primary RS frame, a primary RS frame parade is RS-CRC encoded. The primary RS frame is transmitted (or carried) through a primary parade.

In a secondary RS frame, a secondary RS frame parade is RS-CRC encoded. The secondary RS frame is transmitted (or carried) through a secondary parade.

In an overlay RS frame, an overlay RS frame payload is RS-CRC encoded. The overlay RS frame is transmitted (or carried) through an overlay parade.

A super RS frame corresponds to an RS frame wherein a super RS frame payload is RS-CRC encoded. The super RS frame is transported (or carried) through two arbitrary parades.

An ensemble (also referred to as an M/H ensemble) refers to a collection of RS frame having the same FEC codes. Herein, each RS frame encapsulates a collection of a collection of IP streams.

A primary ensemble corresponds to a collection of consecutive primary RS frames.

A secondary ensemble corresponds to a collection of consecutive secondary RS frames.

An overlay ensemble corresponds to a collection of consecutive overlay RS frames.

A super ensemble (also referred to as a super M/H ensemble) corresponds to a collection of consecutive super RS frames.

In the embodiment of the present invention, data for mobile services may be transmitted by using a portion of the channel capacity that was used to transmit data for main services. Alternatively, data for mobile service may also be transmitted by using the entire channel capacity that was used to transmit data for main services. The data for mobile services correspond to data required for mobile services. Accordingly, the data for mobile services may include actual mobile service data as well as known data, signaling data, RS parity data for error-correcting mobile service data, and so on. In the description of the embodiment of the present invention, the data for mobile services will be referred to as mobile service data or mobile data for simplicity.

The mobile service data may be categorized as mobile service data of a first mobile mode or Core Mobile Mode (CMM) and mobile service data of a second mobile mode or Extended Mobile Mode (EMM) or Scalable Full Channel Mobile Mode (SFCMM).

Furthermore, when the second mobile mode is used along with the first mobile mode, the above-described two modes may be collectively defined as the Scalable Full Channel Mobile Mode (SFCMM).

The first mobile mode is a mode in which Mobile DTV services are transmitted while reserving at least 38 of the 156 packets in each M/H Slot for legacy A/53-compatible services. The second mobile mode is a mode in which Mobile DTV services are transmitted while reserving fewer than 38 of the 156 packets in some or all M/H Slots for legacy A/53-compatible services.

According to the definition of CMM, SFCMM, Ensemble and Parade, the CMM ensemble is a Primary or Secondary Ensemble that is compatible with the CMM system. A CMM Ensemble carries a collection of CMM Services and the SFCMM ensemble is a Primary or Secondary Ensemble that carries a collection of SFCMM Services and is backwards compatible with, but not recognizable by, a CMM receiver/decoder.

And also, the CMM Parade is an M/H Parade that is compatible with the CMM system. A CMM Parade consists of DATA Groups, where each DATA Group does not include the Group Region E and carries an entire RS Frame belonging to the corresponding CMM Ensemble.

The SFCMM Parade is an M/H Parade that is backwards compatible with, but not recognizable by, a CMM system receiver/decoder. An SFCMM Parade consists of DATA Groups, where each DATA Group contains the Group Region E and carries an entire RS Frame belonging to the corresponding SFCMM Ensemble.

The CMM Service is an M/H Service that is compatible with the CMM system. A CMM Service is delivered through a CMM Ensemble. And the CMM Service is an M/H Service that is compatible with the CMM system. A CMM Service is delivered through a CMM Ensemble.

Also, according to an embodiment of the present invention, a group (also referred to as an M/H group or a data group) corresponds to a collection of M/H Encapsulated (MHE) data packets confined within a slot (also referred to as an M/H slot).

A group division corresponds to a collection (or set) of group regions (also referred to as M/H group regions) within a slot. Herein, a group division is categorized into a Primary Group Division or a Secondary Group Division.

A group region corresponds to a collection (or set) of DATA blocks or extended DATA blocks.

A group type is determined by the configuration of a group division within a single group.

Known data is pre-recognized by an agreement between a transmission system and a reception system, and may be used for channel equalization, etc.

FEC is an abbreviation of a Forward Error Correction, and is a generic name of technologies wherein a reception end can spontaneously correct an error of a digital signal transmitted from the transmission end to the reception end without retransmission of a corresponding signal by the transmission end.

TPC is an abbreviation of a Transmission Parameter Channel. TPC is contained in each data group, and then transmitted. The TPC provides information about a data frame and a data group to the reception end, and performs signaling of the provided information.

TS is an abbreviation of a Transport Stream.

RS is an abbreviation of Reed-Solomon.

CRC is an abbreviation of a Cyclic Redundancy Check.

SCCC is an abbreviation of a Serial Concatenated Convolutional Code.

PCCC is an abbreviation of a Parallel Concatenated Convolutional Code.

FIC is an abbreviation of a Fast information channel. FIC carries cross-layer information. This information primarily includes channel binding information between ensembles and services.

Embodiments of the present invention will hereinafter be described with reference to the annexed drawings.

FIG. 1 illustrates a data frame (M/H frame) structure for transmitting/receiving mobile service data according to one embodiment of the present invention.

In the embodiment of the present invention, the mobile service data are first multiplexed with main service data in data frame units and, then, modulated in a VSB mode and transmitted to the receiving system.

The term "data frame" mentioned in the embodiment of the present invention may be defined as the concept of a time during which main service data and mobile service data are transmitted. For example, one data frame may be defined as a time consumed for transmitting 20 VSB data frames.

At this point, one data frame consists of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

In the example shown in FIG. 1, one data frame consists of 5 sub-frames, wherein each sub-frame includes 16 slots. In this case, the data frame according to the present invention includes 5 sub-frames and 80 slots.

Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of payload data as payload data of a segment, a data packet prior to being interleaved may also be used as a data segment.

156 data packets contained in a slot may be composed of 156 main service data packets, may be composed of 118 mobile service data packets and 38 main service data packets, or may be composed of (118+M) mobile service data packets and L main service data packets. In this case, the sum of M and L may be set to 38 according to one embodiment of the present invention. In addition, M may be zero '0' or a natural number of 38 or less.

One data group is transmitted during a single slot. In this case, the transmitted data group may include 118 mobile service data packets or (118+M) mobile service data packets.

That is, a data group may be defined as a set of data units including mobile service data present in one slot. In this case, the mobile service data may be defined as pure mobile service data, or may be defined as the concept that includes data for transmitting mobile service data, such as signaling data, known data, etc.

Figure 2:
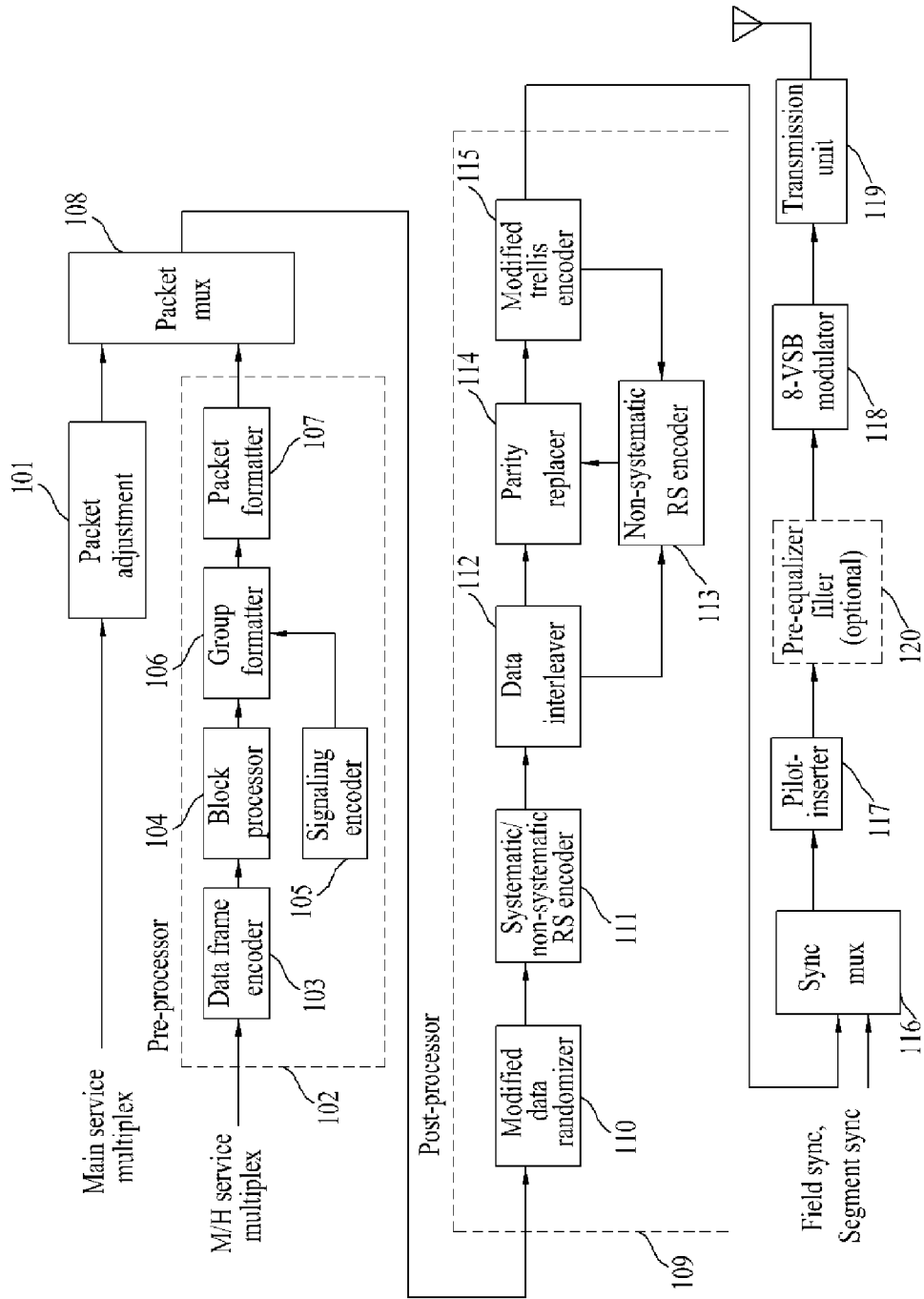
FIG. 2 is a block diagram illustrating a transmission system according to an embodiment of the present invention.

FIG. 2 is a block diagram illustrating a transmission system according to an embodiment of the present invention.

Referring to FIG. 2, the transmission system includes a packet adjustment unit 101, a pre-processor 102, a data frame encoder 103, a block processor 104, a signaling encoder 105, a group formatter 106, a packet formatter 107, a Packet multiplexer (Packet MUX) 108, a post-processor 109, a modified data randomizer 110, a systematic/non-systematic RS encoder 111, a data interleaver 112, a non-systematic RS encoder 113, a parity replacer 114, a modified trellis encoder 115, a synchronization multiplexer (Sync MUX) 116, a pilot inserter 117, a VSB modulator 118, and a Radio Frequency (RF) up-converter 119. In addition, the transmission system of FIG. 2 may further include a pre-equalizer filter 120.

When a mobile service data packet and a main service data packet are multiplexed, there may occur a displacement between a service stream packet including a mobile service stream and another service stream packet including no mobile service stream. In order to compensate for the displacement, the packet adjustment unit 101 may be used.

The pre-processor 102 configures mobile service data in a form of a mobile service structure for transmitting the mobile service data. In addition, the pre-processor 102 performs additional FEC coding of mobile service data. Also, the pre-processor 102 inserts known data. That is, the pre-processor 102 increases the stability of transmission and reception of mobile service data under a mobile environment.

Also, the pre-processor 102 performs an additional encoding process on the mobile service data of the first mobile mode extracted from the mobile service data packet of the first mobile mode and/or on the mobile service data of the second mobile mode extracted from the mobile service data packet of the second mobile mode, and the pre-processor 102 also performs a group forming process enabling data to be positioned in a specific position depending upon the purpose of the data that are to be transmitted to the transmission frame. Such processes are performed to enable the mobile service data to respond more swiftly and with robustness against noise and change in channels.

The pre-processor 102 may include a data frame encoder 103, a block processor 103, a block processor 104, a signaling encoder 105, a group formatter 106, a packet formatter 107, and a packet multiplexer (packet MUX) 108. In other words, the above-mentioned constituent components may be contained in the pre-processor 102, and may be configured separately from the pre-processor 102.

The data frame encoder 103 randomizes mobile service data of the first mobile mode or second mobile mode, and performs RS encoding and CRC encoding of the mobile service data to build RS frame.

The mobile service data included in the RS frame may correspond to mobile service data of the first mobile mode, or may correspond to mobile service data of the second mobile mode. Furthermore, the RS frame may include both the mobile service data of the first mobile mode and the mobile service data of the second mobile mode.

Herein, the mobile service data may be broadly divided into two types of mobile modes. One of the mobile modes is referred to as a first mobile mode or a Core Mobile Mode (CMM), and the other mobile mode is referred to as a second mobile mode or a Scalable Full Channel Mobile Mode (SFCMM). Furthermore, the first mobile mode and the second mobile mode may be collectively referred to as the Scalable Full Channel Mobile Mode (SFCMM).

More specifically, SFCMM is a mode in which Mobile DTV services are transmitted while reserving fewer than 38 of the 156 packets in some or all M/H Slots for legacy A/53-compatible services. Also SFCMM can be said as a mode in which the mobile service data are transmitted while reserving greater than 118 packets out of 156 packets in the slot. And CMM is a mode in which Mobile DTV services are transmitted while reserving at least 38 of the 156 packets in each M/H Slot for legacy A/53-compatible services. Also CMM can be said as a mode in which the mobile service data are transmitted while reserving less than or equal to 118 packets out of 156 packets in the slot The first mobile mode corresponds to a mode that is compatible with the conventional mobile broadcasting system. And, the second mobile mode may be either compatible or non-compatible with the conventional mobile service data. However, the second mobile mode corresponds to a mode that transmits data that cannot be recognized (or acknowledged) by the conventional mobile broadcasting system.

Only mobile service data of the first mobile mode may be allocated to one group, or only mobile service data of the second mobile mode may be allocated to the one group. Alternatively, both the mobile service data of the first mobile mode and the mobile service data of the second mobile mode may both be allocated to one group.

Although the data of the RS frame being outputted include raw (i.e., non-processed) mobile service data, CRC data, stuffing data, and so on, in a broader definition, such data all correspond to data for mobile services. Therefore, the data of each frame will hereinafter be described under the assumption that the data all correspond to mobile service data.

The block processor 104 converts an RS frame portion into an SCCC block. The block processor 104 converts a mobile service data byte contained in the SCCC block into bit-based mobile service data. The block processor 104 performs convolution encoding of ½, ⅓, or ¼ rate on the bit-based mobile service data. In this case, the ½ rate means an encoding process in which two bits are output in response to an input of one bit, the ⅓ rate means an encoding process in which three bits are output in response to an input of two bits, and the ¼ rate means an encoding process in which four bits are output in response to an input of four bits. Output bits are contained in a symbol. The block processor 104 performs interleaving of the convolution-encoded output symbol. The block processor 104 converts an interleaved symbol into byte-based data, and converts an SCCC block into a data block. A detailed description of the data block will hereinafter be described in detail.

The signaling encoder 105 generates signaling information for signaling at a reception end, performs FEC encoding and PCCC encoding of the generated signaling information, and inserts the signaling information into some regions of the data group. For example, examples of the signaling information may be a transmission parameter channel (TPC) data, fast information channel (FIC) data, and the like.

The group formatter 106 forms a data group using the output data of the block processor 104. The group formatter 106 maps FEC-encoded mobile service data to an interleaved form of a data group format. At this time, the above-mentioned mapping is characterized in that FEC-encoded mobile service data is inserted into either a data block of a corresponding group or a group region according to a coding rate of each FEC-encoded mobile service data received from the block processor 104. In addition, the group formatter 106 inserts signaling data, a data byte used for initializing the trellis encoder, and a known data sequence. Further, the group formatter 106 inserts main service data, and a place-holder for an MPEG-2 header and a non-systematic RS parity. The group formatter 106 may insert dummy data to generate a data group of a desired format. After inserting various data, the group formatter 106 performs deinterleaving of data of the interleaved data group. After performing the deinterleaving operation, the data group returns to an original group formed before the interleaving operation.

The packet formatter 107 converts output data of the group formatter 106 into a Transport Stream (TS) packet. In this case, the TS packet is a mobile service data packet. In addition, the output of the packet formatter 107 according to an embodiment of the present invention is characterized in that it includes (118+M) mobile service data packets in a single data group. In this case, M is 38 or less.

The packet multiplexer (Packet MUX) 108 multiplexes a packet including mobile service data processed by the pre-processor 102 and a packet including main service data output from the packet adjustment unit 101. In this case, the multiplexed packet may include (118+M) mobile service data packets and L main service data packets. For example, according to an embodiment of the present invention, M is any one of integers from 0 to 38, and the sum of M and L is set to 38. In other words, although the packet multiplexer (packet MUX) 108 may multiplex the mobile service data packet and the main service data packet, in the case where the number of input main service data packets is set to '0' (i.e., L=0), only the mobile service data packet is processed by the packet multiplexer (packet MUX) 108, such that the packet multiplexer (packet MUX) 108 outputs the processed mobile service data packet only.

The post-processor 109 processes mobile service data in such a manner that the mobile service data generated by the present invention can be backward compatible with a conventional broadcast system. In accordance with one embodiment of the present invention, the post-processor 109 may include a modified data randomizer 110, a systematic/non-systematic RS encoder 111, a data interleaver 112, a non-systematic RS encoder 113, a parity replacer 114 and a modified trellis encoder 115. In other words, each of the above-mentioned constituent components may be located outside of the post-processor 109 according to the intention of a designer as necessary.

The modified data randomizer 110 does not perform randomizing of a mobile service TS packet, and bypasses a mobile service TS packet. The modified data randomizer 110 performs randomizing of the main service data TS packet. Therefore, according to one embodiment of the present invention, the randomizing operation is not performed when a data group generated by the pre-processor 102 has no main service data.

In the case where input data is a main service data packet, the systematic/non-systematic RS encoder 111 performs systematic RS encoding of the main service data packet acting as the input data, such that it generates RS FEC data. In the case where input data is a mobile service data packet, the systematic/non-systematic RS encoder 111 performs non-systematic RS encoding, such that it generates RS FEC data. In accordance with one embodiment of the present invention, the systematic/non-systematic RS encoder 111 generates RS FEC data having the size of 20 bytes during the systematic/non-systematic RS encoding process. The RS FEC data generated in the systematic RS encoding process is added to the end of a packet having the size of 187 bytes. RS FEC data generated in the non-systematic RS encoding process is inserted into the position of an RS parity byte predetermined in each mobile service data packet. Therefore, according to one embodiment of the present invention, in the case where the data group generated by the pre-processor has no main service data, the systematic RS encoder 111 for main service data performs no RS encoding. In this case, the non-systematic RS encoder 111 does not generate a non-systematic RS parity for backward compatibility.

The data interleaver 112 performs byte-based interleaving of data that includes main service data and mobile service data.

In the case where it is necessary to initialize the modified trellis encoder 115, the non-systematic RS encoder 113 receives an internal memory value of the modified trellis encoder 115 as an input, and receives mobile service data from the data interleaver 112 as an input, such that it changes initialization data of mobile service data to a memory value. The non-systematic RS encoder 113 performs non-systematic RS encoding of the changed mobile service data, and outputs the generated RS parity to the parity replacer 114.

In the case where it is necessary to initialize the modified trellis encoder 115, the parity replacer 114 receives mobile service data output from the data interleaver 112, and replaces an RS parity of the mobile service data with an RS parity generated from the non-systematic RS encoder 113.

In the case where the data group generated in the pre-processor does not include main service data at all, the data group need not have an RS parity for backward compatibility. Accordingly, in accordance with one embodiment of the present invention, the non-systematic RS encoder 113 and the parity replacer 114 do not perform each of the above-mentioned operations, and bypass corresponding data.

The modified trellis encoder 115 performs trellis encoding of output data of the data interleaver 112. In this case, in order to allow data formed after the trellis encoding to have known data pre-engaged between a transmission end and a reception end, a memory contained in the modified trellis encoder 115 should be initialized before the beginning of the trellis encoding. The above-mentioned initialization operation begins by trellis initialization data belonging to a data group.

The synchronization multiplexer (Sync MUX) 116 inserts a field synchronization signal and a segment synchronization signal into output data of the modified trellis encoder 115, and multiplexes the resultant data.

The pilot inserter 117 receives the multiplexed data from the synchronization multiplexer (Sync MUX) 116, and inserts a pilot signal, that is used as a carrier phase synchronization signal for demodulating a channel signal at a reception end, into the multiplexed data.

The VSB modulator 118 performs VSB modulation so as to transmit data.

The transmission unit 119 performs frequency up-conversion of the modulated signal, and transmits the resultant signal.

In the present invention, the transmitting system provides backward compatibility in the main service data so as to be received by the conventional receiving system. Herein, the main service data and the mobile service data are multiplexed to the same physical channel and then transmitted.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

FIG. 3 illustrates a data frame encoder according to an embodiment of the present invention.

(a) of FIG. 3 corresponds to an example of a data frame encoder. The data frame encoder receives a plurality of ensembles, and an input demultiplexer outputs the received ensembles by distributing the received ensembles to each RS frame encoder. The output of each RS frame encoder passes through an output multiplexer, so as to become the output of the data frame encoder. According to the embodiment of the present invention, one data frame encoder includes a number of RS frame encoders corresponding to the number of the received ensembles.

(b) of FIG. 3 corresponds to an example of an RS frame encoder. The RS frame encoder may include a data randomizer 3010, an RS-CRC encoder 3020, and an RS Frame divider 3030.

The data randomizer 3010 randomizes data. The data randomizer 3010 within the RS frame encoder randomizes an (N×187)-byte RS frame payload included in the received ensemble. Thereafter, the randomized result is outputted to the RS-CRC encoder.

The RS-CRC encoder 3020 performs forward error correction (FEC) encoding on the mobile service data, thereby building (or creating) an RS frame. At this point, the built (or created) RS frame may correspond to a primary RS frame or a combination of a primary RS frame and a secondary RS frame.

The RS frame divider 3030 divides the RS frame into a plurality of data portions. Herein, according to the embodiment of the present invention, one data portion forms one data group.

A CMM primary ensemble, a CMM secondary ensemble, an EMM primary ensemble, an EMM secondary ensemble, and a super ensemble may be inputted as the input of the RS frame encoder. When a primary ensemble is inputted, primary RS frame portions are outputted from the RS frame divider. And, when a secondary ensemble is inputted, secondary RS frame portions are outputted from the RS frame divider.

Figure 4:
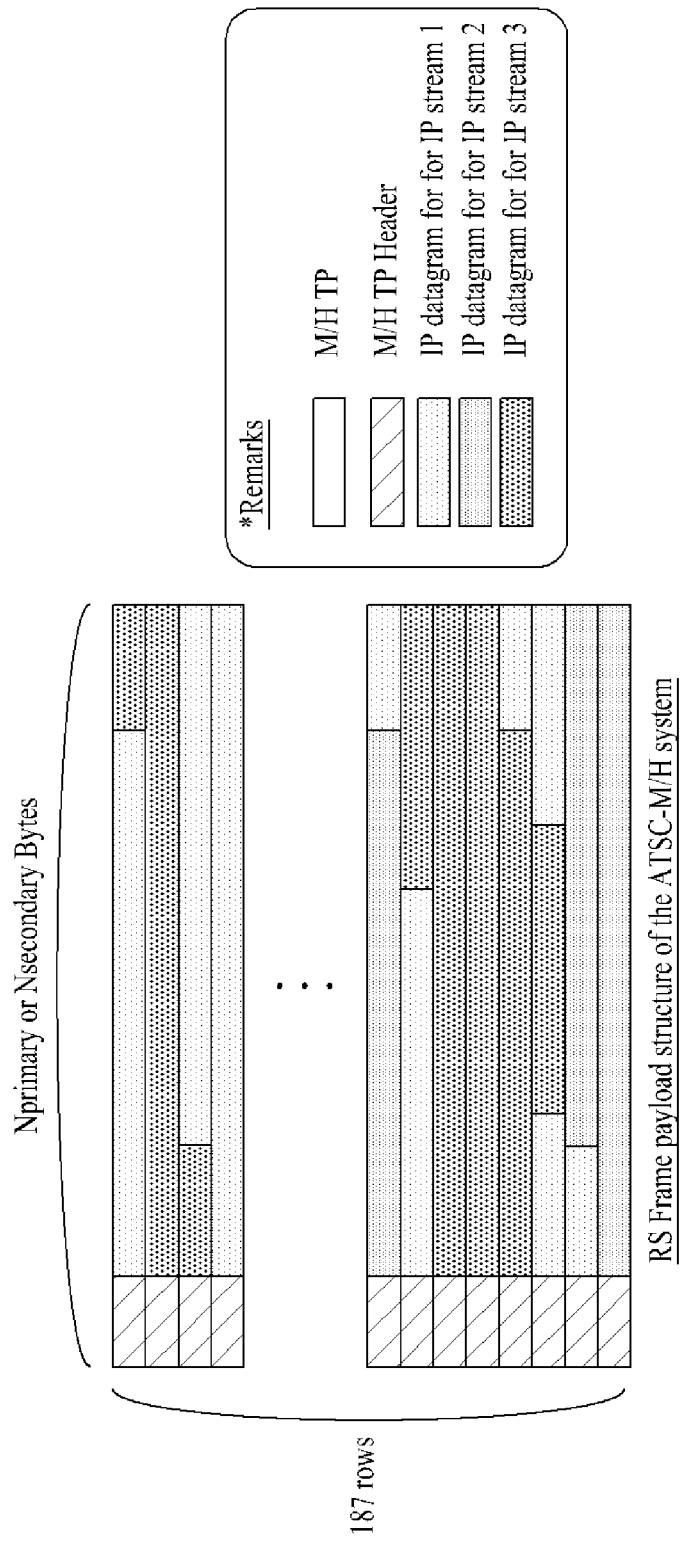
FIG. 4 illustrates a payload of an RS frame being outputted from a data frame encoder 103 according to an embodiment of the present invention.

FIG. 4 illustrates a payload of an RS frame being outputted from a data frame encoder 103 according to an embodiment of the present invention.

Payloads of the RS frame are gathered (or collected) to form an ensemble. Herein, an ensemble corresponds to a collection of services having the same quality of service (QoS).

A data frame encoder 103 includes at least one or more RS frame encoders. Herein, one RS frame encoder receives one RS frame payload and encodes the received RS frame payload, thereby outputting the encoded RS frame payload.

According to the embodiment of the present invention, the RS frame payload has the size of (N×187) bytes. Herein, N represents the length of a row (i.e., the number of columns), and 187 indicates the length of a column the number of rows).

According to the embodiment of the present invention, each row configured of N bytes will be referred to as a mobile service data packet for simplicity. The mobile service data packet may include a 2-byte header and an (N−2)-byte mobile service payload. Herein, the assignment of 2 bytes to the header region is merely exemplary. Accordingly, the assignment of the data bytes may be varied and modified by the system designer. Therefore, the present invention will not be limited only to the examples given in the description of the present invention.

According to the embodiment of the present invention, each row configured of N bytes will be referred to as a mobile service data packet for simplicity. The mobile service data packet may include a 2-byte header and an (N−2)-byte mobile service payload. Herein, the assignment of 2 bytes to the header region is merely exemplary. Accordingly, the assignment of the data bytes may be varied and modified by the system designer. Therefore, the present invention will not be limited only to the examples given in the description of the present invention.

One RS frame payload is created by gathering (or collecting) table information and/or IP datagrams having the size of (N−2)×187 bytes from one ensemble. Also, one RS frame payload may include table information and IP datagrams corresponding to at least one or more mobile services. For example, IP datagrams and table information for two different types of mobile services, such as news (e.g., IP datagram for mobile service 1) and stock information (e.g., IP datagram for mobile service 2), may be included in one RS frame payload.

More specifically, table information of a section structure or IP datagrams of mobile service data may be assigned to a mobile payload within a mobile service data packet included in the RS frame payload. Alternatively, IP datagrams of table information or IP datagrams of mobile service data may be assigned to a mobile payload within a mobile service data packet included in the RS frame payload.

In case the size of a mobile service data packet does not reach the size of N bytes, even when including a mobile header, stuffing data bytes may be assigned to the remaining payload portion of the corresponding mobile service data packet. For example, after assigning program table information to a mobile service data packet, if the length of the mobile service data packet including the header is (N−20) bytes, stuffing data bytes may be assigned to the remaining 20-byte portion of the corresponding mobile service data packet.

FIG. 5 illustrate a process of one or two RS frame being divided into several portions, based upon an RS frame mode value, and a process of each portion being assigned to a corresponding region within the respective data group.

According to an embodiment of the present invention, the data assignment within the data group is performed by the group formatter.

More specifically, (a) of FIG. 5 shows an example of the RS frame mode value being equal to '00'. Herein, only the primary encoder operates, thereby forming one RS frame for one parade. Then, the RS frame is divided into several portions, and the data of each portion are assigned to regions A/B/C/D/E within the respective data group.

(b) of FIG. 5 shows an example of the RS frame mode value being equal to '01'. Herein, both the primary encoder and the secondary encoder operate, thereby forming two RS frames for one parade, i.e., one primary RS frame and one secondary RS frame. Then, the primary RS frame is divided into several portions, and the secondary RS frame is divided into several portions. At this point, the data of each portion of the primary RS frame are assigned to regions A/B within the respective data group. And, the data of each portion of the secondary RS frame are assigned to regions CAVE within the respective data group.

Figure 6:
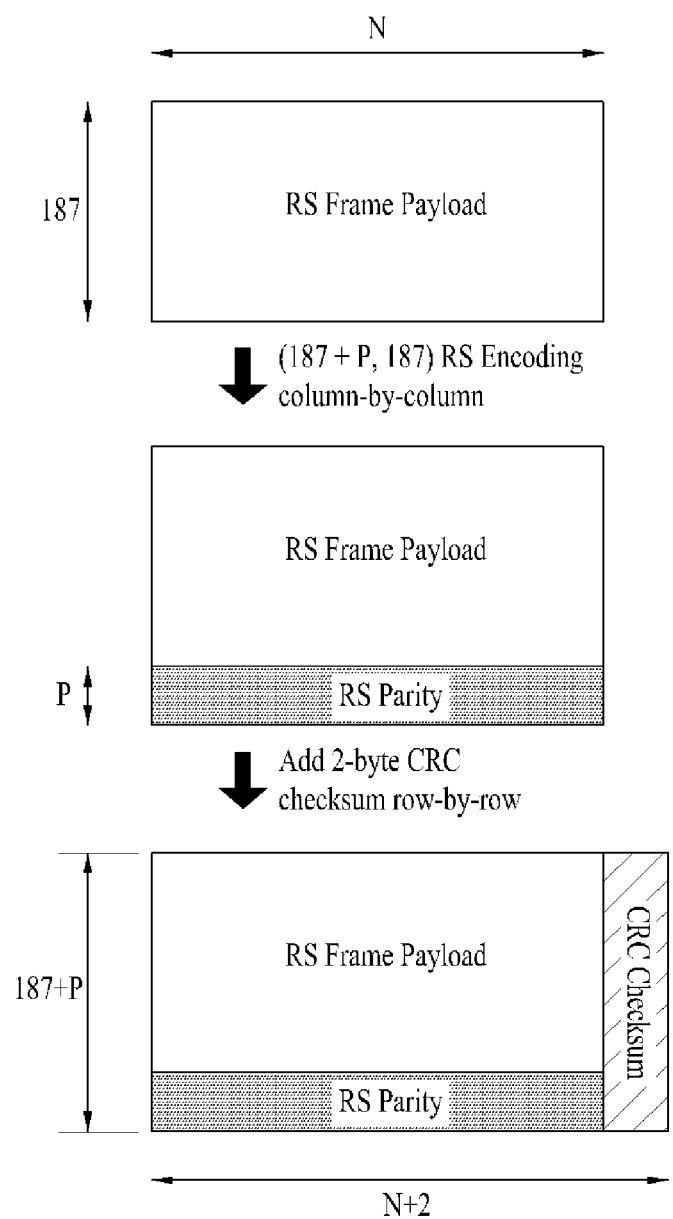
FIG. 6 illustrates the operations of an RS-CRC encoder according to an embodiment of the present invention.

FIG. 6 illustrates the operations of an RS-CRC encoder according to an embodiment of the present invention.

(a) of FIG. 6 illustrates an example of an RS frame being generated from the RS-CRC encoder according to the present invention.

When the RS frame payload is formed, as shown in (a) of FIG. 6, the RS-CRC encoder performs a (Nc,Kc)-RS encoding process on each column, so as to generate Nc-Kc(=P) number of parity bytes. Then, the RS-CRC encoder adds the newly generated P number of parity bytes after the very last byte of the corresponding column, thereby creating a column of (187+P) bytes. Herein, as shown in (a) of FIG. 6, Kc is equal to 187 (i.e., Kc=187), and Nc is equal to 187+P (i.e., Nc=187+P). Herein, the value of P may vary depending upon the RS code mode. Table a below shows an example of an RS code mode, as one of the RS encoding information.

TABLE 1

| RS code mode | RS code | Number of parity bytes (P) |
| --- | --- | --- |
| 00 | (211, 187) | 24 |
| 01 | (223, 187) | 36 |
| 10 | (235, 187) | 48 |
| 11 | Reserved | Reserved |

Table 1 shows an example of 2 bits being assigned in order to indicate the RS code mode. The RS code mode represents the number of parity bytes corresponding to the RS frame payload.

For example, when the RS code mode value is equal to '10', (235,187)-RS-encoding is performed on the RS frame payload of FIG. 48(*a*), so as to generate 48 parity data bytes. Thereafter, the 48 parity bytes are added after the last data byte of the corresponding column, thereby creating a column of 235 data bytes.

When the RS frame mode value is equal to '00' in Table 1 (i.e., when the RS frame mode indicates a single RS frame), only the RS code mode of the corresponding RS frame is indicated. However, when the RS frame mode value is equal to '01' in Table 1 (i.e., when the RS frame mode indicates multiple RS frames), the RS code mode corresponding to a primary RS frame and a secondary RS frame. More specifically, it is preferable that the RS code mode is independently applied to the primary RS frame and the secondary RS frame.

When such RS encoding process is performed on all N number of columns, a size of N(row)×(187+P)(column) bytes may be generated, as shown in (b) of FIG. 6.

Each row of the RS frame payload is configured of N bytes. However, depending upon channel conditions between the transmitting system and the receiving system, error may be included in the RS frame payload. When errors occur as described above, CRC data (or CRC code or CRC checksum) may be used on each row unit in order to verify whether error exists in each row unit.

The RS-CRC encoder may perform CRC encoding on the mobile service data being RS encoded so as to create (or generate) the CRC data. The CRC data being generated by CRC encoding may be used to indicate whether the mobile service data have been damaged while being transmitted through the channel.

The present invention may also use different error detection encoding methods other than the CRC encoding method. Alternatively, the present invention may use the error correction encoding method to enhance the overall error correction ability of the receiving system.

(c) of FIG. 6 illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 1 below corresponds to an exemplary equation for generating a 2-byte CRC checksum for each row being configured of N number of bytes.

$$g(x)=x^{16}+x^{12}+x^5+1 \quad \text{[Equation 1]}$$

The process of adding a 2-byte checksum in each row is only exemplary. Therefore, the present invention is not limited only to the example proposed in the description set forth herein. As described above, when the process of RS encoding and CRC encoding are completed, the (N×187)-byte RS frame payload is converted into a (N+2)×(187+P)-byte RS frame.

The RS frame having the size of (N+2)×(187+P) bytes, which is created by the RS-CRC encoder, is outputted to the RS frame divider.

When an RS frame payload created from a primary ensemble is inputted to the RS frame encoder, the RS-CRC encoder generates (or creates) a primary RS frame. Thereafter, the generated primary RS frame passes through the RS frame divider, so as to be transmitted through the primary parade.

When an RS frame payload created from a secondary ensemble is inputted to the RS frame encoder, the RS-CRC encoder generates (or creates) a secondary RS frame. Thereafter, the generated secondary RS frame passes through the RS frame divider, so as to be transmitted through the secondary parade.

The RS frame divider receives the RS frame having the size of (N+2)×(187+P) bytes, which is outputted from the RS-CRC encoder. Thereafter, the RS frame divider divides the received RS frame into a plurality of portions, thereby outputting the divided portions.

Figure 7:
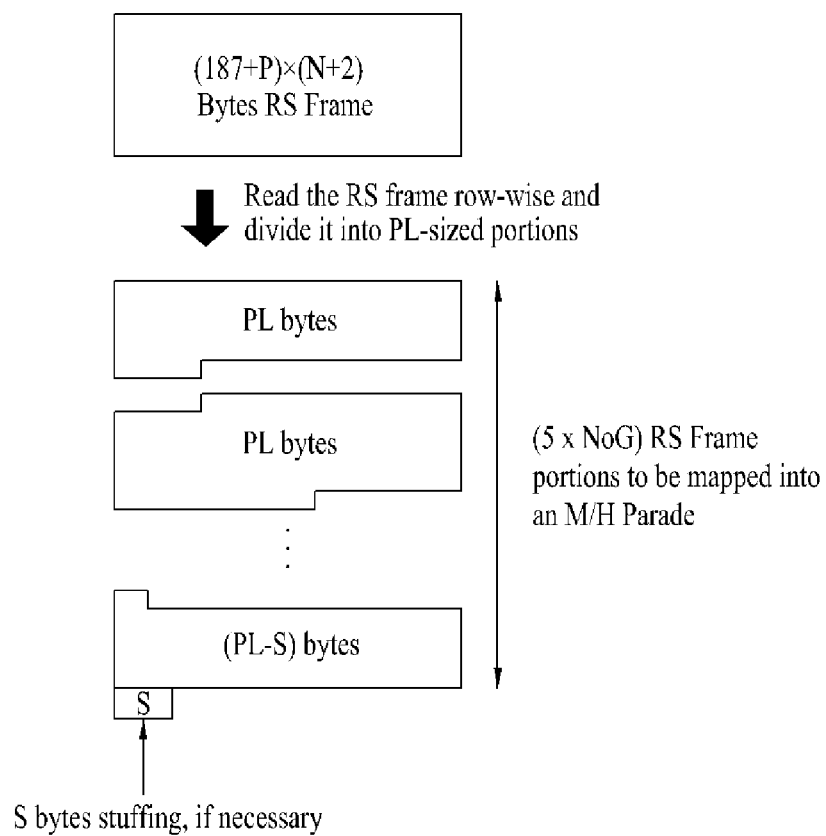
FIG. 7 illustrates the operation of the RS frame divider according to an embodiment of the present invention, when the output of the RS frame encoder corresponds to a primary RS frame or a secondary RS frame.

FIG. 7 illustrates the operation of the RS frame divider according to an embodiment of the present invention, when the output of the RS frame encoder corresponds to a primary RS frame or a secondary RS frame.

At this point, the number of portions divided and created from one RS frame is equal to 5×NOG. Herein, 5 corresponds to the number of sub frames existing in one M/H frame, and NOG corresponds to the number of group having a parade assigned to one subframe.

Herein, one portion includes data of PL bytes.

At this point, one portion is assigned to one group division, thereby being transmitted.

When dividing an RS frame having the size of (N+2)×(187+P) bytes into (5×NOG) number of portions, wherein each portion includes PL bytes, one portion may have a byte size smaller than PL bytes. In this case, the last portion may include RS frame data having the size of (PL-S) bytes and may also include additional data byes of S bytes, wherein S has a random value.

Figure 8:
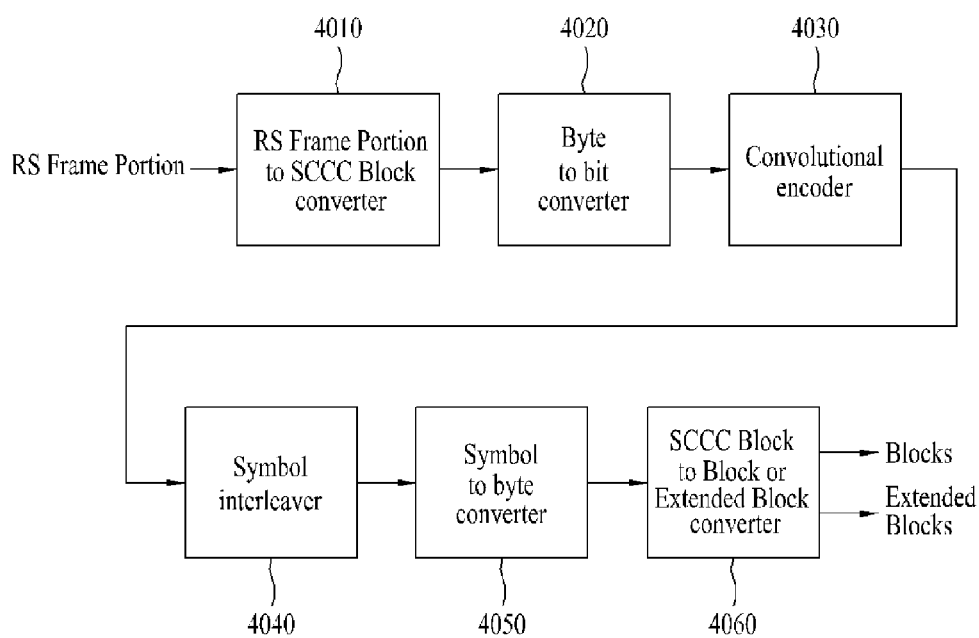
FIG. 8 illustrates a diagram showing a detailed structure of a block processor according to an embodiment of the present invention.

FIG. 8 illustrates a diagram showing a detailed structure of a block processor according to an embodiment of the present invention.

The block processor includes an SCCC block converter 4010, a byte to bit converter 4020, a convolutional encoder 4030, a symbol interleaver 4040, a symbol to byte converter 4050, and a data block converter 4060.

The SCCC block converter 4010 divides a primary RS frame portion outputted from the data frame encoder into a plurality of SCCC blocks, or the SCCC block converter 4010 divides both a primary RS frame portion and a secondary RS frame portion outputted from the data frame encoder into a plurality of SCCC blocks. The number of SCCC blocks that are divided from the RS frame portion(s) outputted from the data frame encoder may be known by SCCC_block_mode information, which is included in the TPC.

The byte-to-bit converter 4020 shall convert parallel bytes to serial bits for the purpose of bit-wise operation in the convolutional encode.

The convolutional encoder 4030 performs outer convolutional coding for the SCCC. The coding rate of the convolutional encoder can be one of 1/2 rate, 1/3 rate and 1/4 rate.

The symbol interleaver 4040 scrambles the output symbols from the convolutional encoder. The symbol interleaver is a type of Block interleaver The symbol-to-byte converter converts the interleaved symbols into bytes. The MSB of the output byte shall be the MSB in the first input symbol.

The data block converter 4060 maps the SCCC blocks to data blocks or data blocks and extended data blocks.

More specifically, the block processor forms (or configures) an SCCC block after receiving portions of the RS frame from the DATA frame encoder. Thereafter, the block processor outputs the SCCC block in a data block format. At this point, an extended data block is also included in the outputted data block.

According to the embodiment of the present invention, the convolutional encoder encodes the mobile service data of the first mobile mode and the mobile service data of the second mobile mode at a coding rate of 1/2 , a coding rate of 1/4 , or a coding rate of 1/3.

Figure 9:
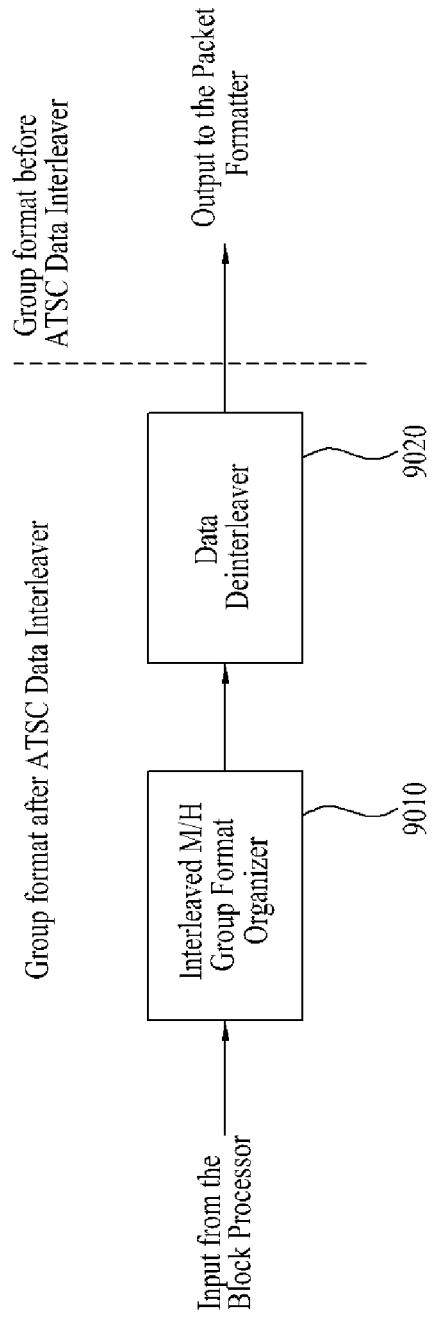
FIG. 9 illustrates a diagram showing a detailed structure of a group formatter according to an embodiment of the present invention.

FIG. 9 illustrates a diagram showing a detailed structure of a group formatter according to an embodiment of the present invention.

The group formatter may include a group format organizer 9010, and a data deinterleaver 9020. The group format organizer 9010 inserts mobile service data, signaling data and respective place holders in the corresponding regions within the data group. The signaling data includes TPC (Transmission Parameter Channel) data which includes transmission parameters required for baseband processing in a receiver and FIC (Fast Information Channel) data containing cross layer information between a physical layer and an upper layer. And, the data deinterleaver 9020 deinterleaves the inserted data and respective place holders as an inverse process of the data interleaver.

Figure 10:
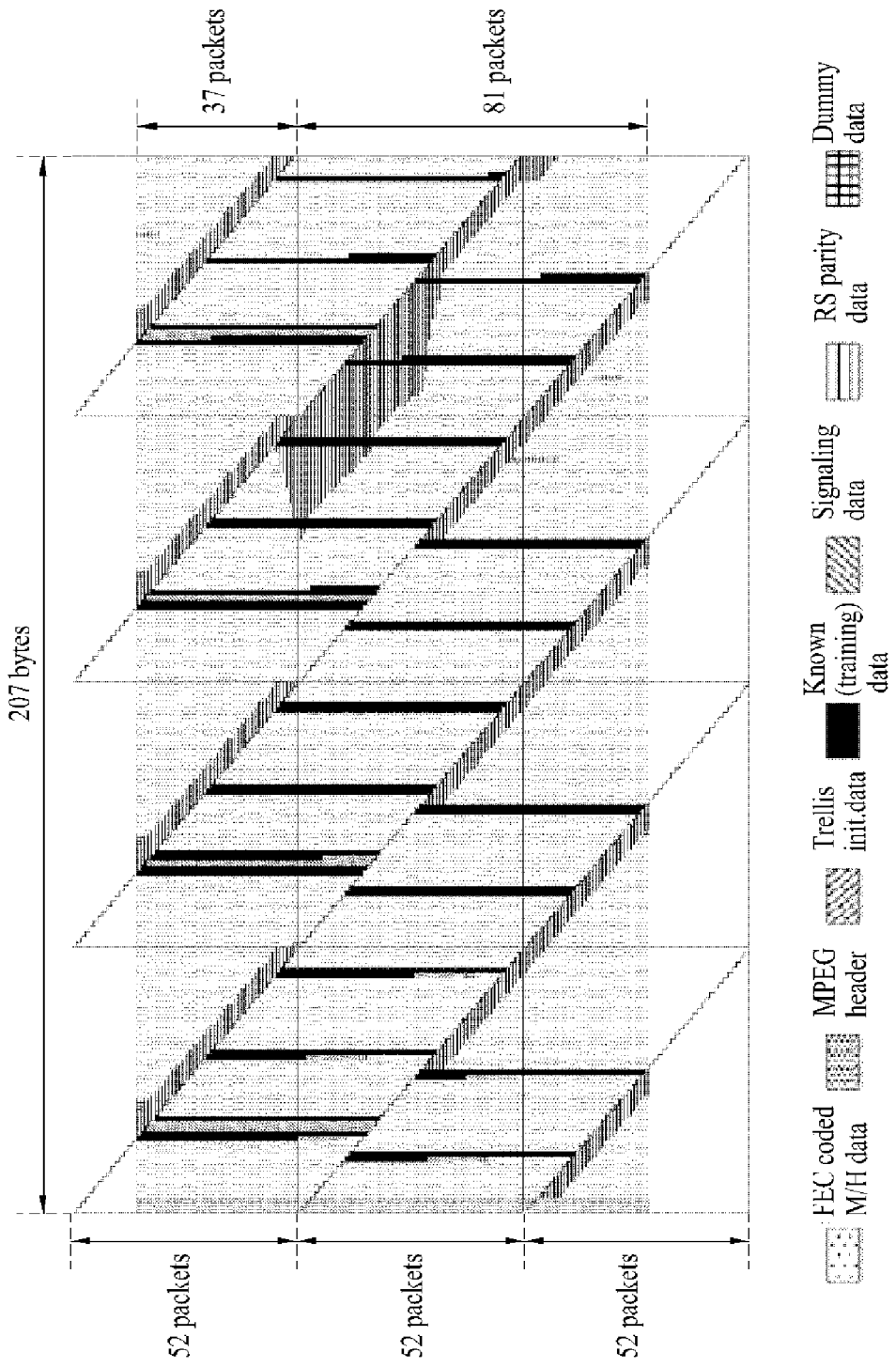
FIG. 10 illustrates a structure acquired data group before the data group is interleaved, when the data group includes 118 of mobile service data packets, according to an embodiment of the present invention.

FIG. 10 illustrates a structure acquired data group before the data group is interleaved, when the data group includes 118 of mobile service data packets, according to an embodiment of the present invention.

Referring to FIG. 10, the data group includes 118 TS packets that include at least one of FEC-encoded mobile service data, MPEG header, trellis initialization data, known data, signaling data, RS parity data and dummy data. For convenience of description and better understanding of the present invention, a TS packet contained in the data group is defined as a mobile service data packet according to the present invention.

The data group shown in FIG. 10 includes 118 mobile service data packets, such that it can be recognized that the slot via which the above-mentioned data group is transmitted is used for transmitting 38 main service data packets.

Figure 11:
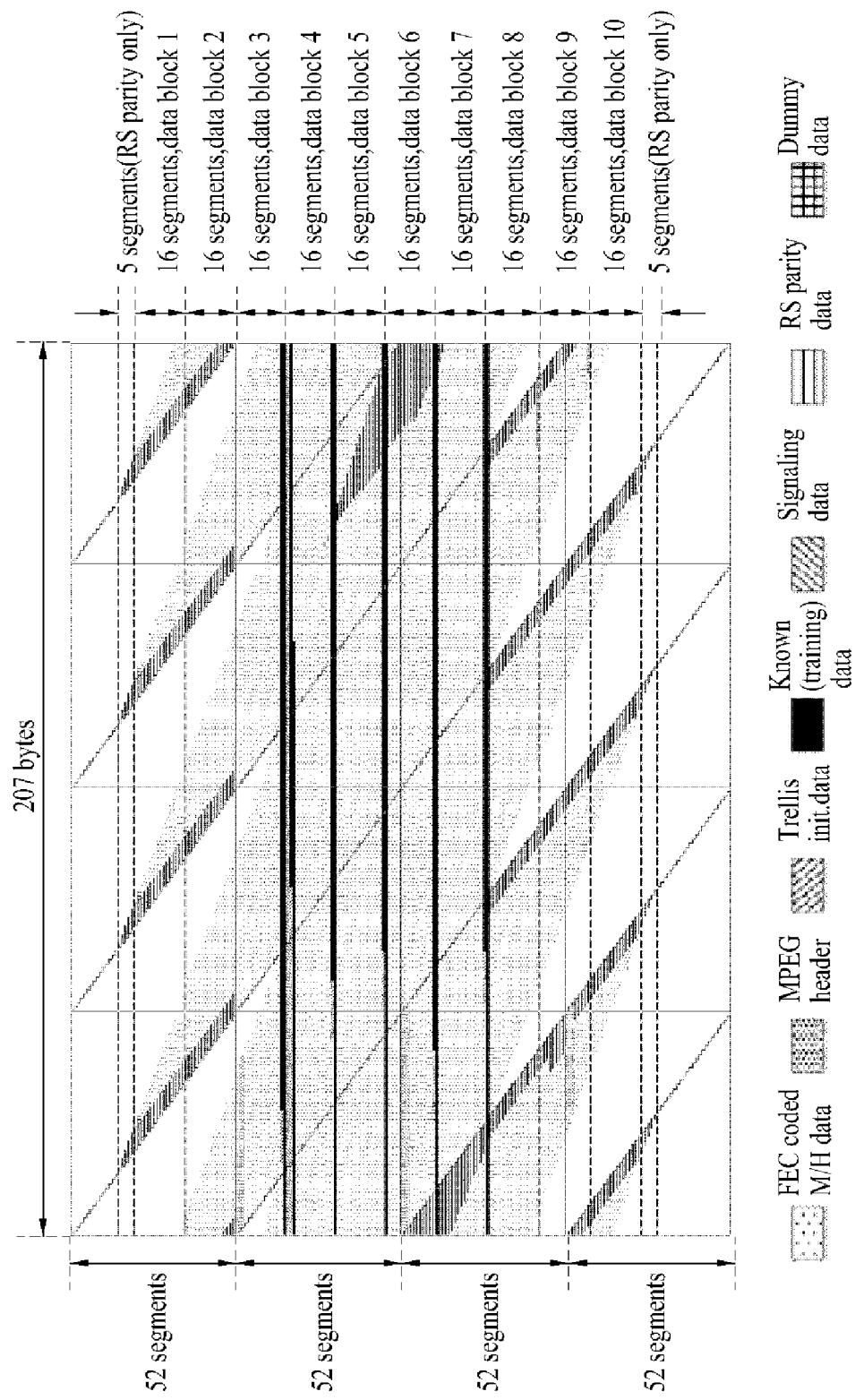
FIG. 11 illustrates a structure acquired data group after the data group is interleaved, when the data group includes 118 mobile service data packets, according to an embodiment of the present invention.

FIG. 11 illustrates a structure acquired data group after the data group is interleaved, when the data group includes 118 mobile service data packets, according to an embodiment of the present invention.

Referring to FIG. 11, the data group including 118 mobile service data packets is interleaved such that a data group including 170 segments is formed.

In this case, the above-mentioned example in which 118 mobile service data packets are distributed to 170 segments has been disclosed only for illustrative purposes and better understanding of the present invention. The number of data segments formed after the data group is interleaved may be changed to another according to the degree of interleaving.

FIG. 11 shows an example of dividing a data group prior to being data-interleaved into 10 DATA blocks (i.e., DATA block 1 (B1) to DATA block 10 (B10)). In other word, DATA Block can be defined as a transmission block containing mobile service data or main and mobile service data in segment level. In this example, each DATA block has the length of 16 segments. Referring to FIG. 11, only the RS parity data are allocated to a portion of 5 segments before the DATA block 1 (B1) and 5 segments behind the DATA block 10 (B10). The RS parity data are excluded in regions A to D of the data group.

More specifically, when it is assumed that one data group is divided into regions A, B, C, and D, each DATA block may be included in any one of region A to region D depending upon the characteristic of each DATA block within the data group. At this point, according to an embodiment of the present invention, each DATA block may be included in any one of region A to region D based upon an interference level of main service data.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 11, DATA block 4 (B4) to DATA block 7 (B7) correspond to regions without interference of the main service data. DATA block 4 (B4) to DATA block 7 (B7) within the data group shown in FIG. 11 correspond to a region where no interference from the main service data occurs. In this example, a long known data sequence is inserted at both the beginning and end of each DATA block. In the description of the present invention, the region including DATA block 4 (B4) to DATA block 7 (B7) will be referred to as "region A (=B4+B5+B6+B7)". As described above, when the data group includes region A having a long known data sequence inserted at both the beginning and end of each DATA block, the receiving system is capable of performing equalization by using the channel information that can be obtained from the known data. Therefore, the strongest equalizing performance may be yielded (or obtained) from one of region A to region D.

In the example of the data group shown in FIG. 11, DATA block 3 (B3) and DATA block 8 (B8) correspond to a region having little interference from the main service data. Herein, a long known data sequence is inserted in only one side of each DATA block B3 and B8. More specifically, due to the interference from the main service data, a long known data sequence is inserted at the end of DATA block 3 (B3), and another long known data sequence is inserted at the beginning of DATA block 8 (B8). In the present invention, the region including DATA block 3 (B3) and DATA block 8 (B8) will be referred to as "region B(=B3+B8)". As described above, when the data group includes region B having a long known data sequence inserted at only one side (beginning or end) of each DATA block, the receiving system is capable of performing equalization by using the channel information that can be obtained from the known data. Therefore, a stronger equalizing performance as compared to region C/D may be yielded (or obtained).

Referring to FIG. 11, DATA block 2 (B2) and DATA block 9 (B9) correspond to a region having more interference from the main service data as compared to region B. A long known data sequence cannot be inserted in any side of DATA block 2 (B2) and DATA block 9 (B9). Herein, the region including DATA block 2 (B2) and DATA block 9 (B9) will be referred to as "region C(=B2+B9)".

Finally, in the example shown in FIG. 11, DATA block 1 (B1) and DATA block 10 (B10) correspond to a region having more interference from the main service data as compared to region C. Similarly, a long known data sequence cannot be inserted in any side of DATA block 1 (B1) and DATA block 10 (B10).

Referring to FIG. 11, it can be readily recognized that the regions A and B of the data group includes signaling data used for signaling at a reception end.

Figure 12:
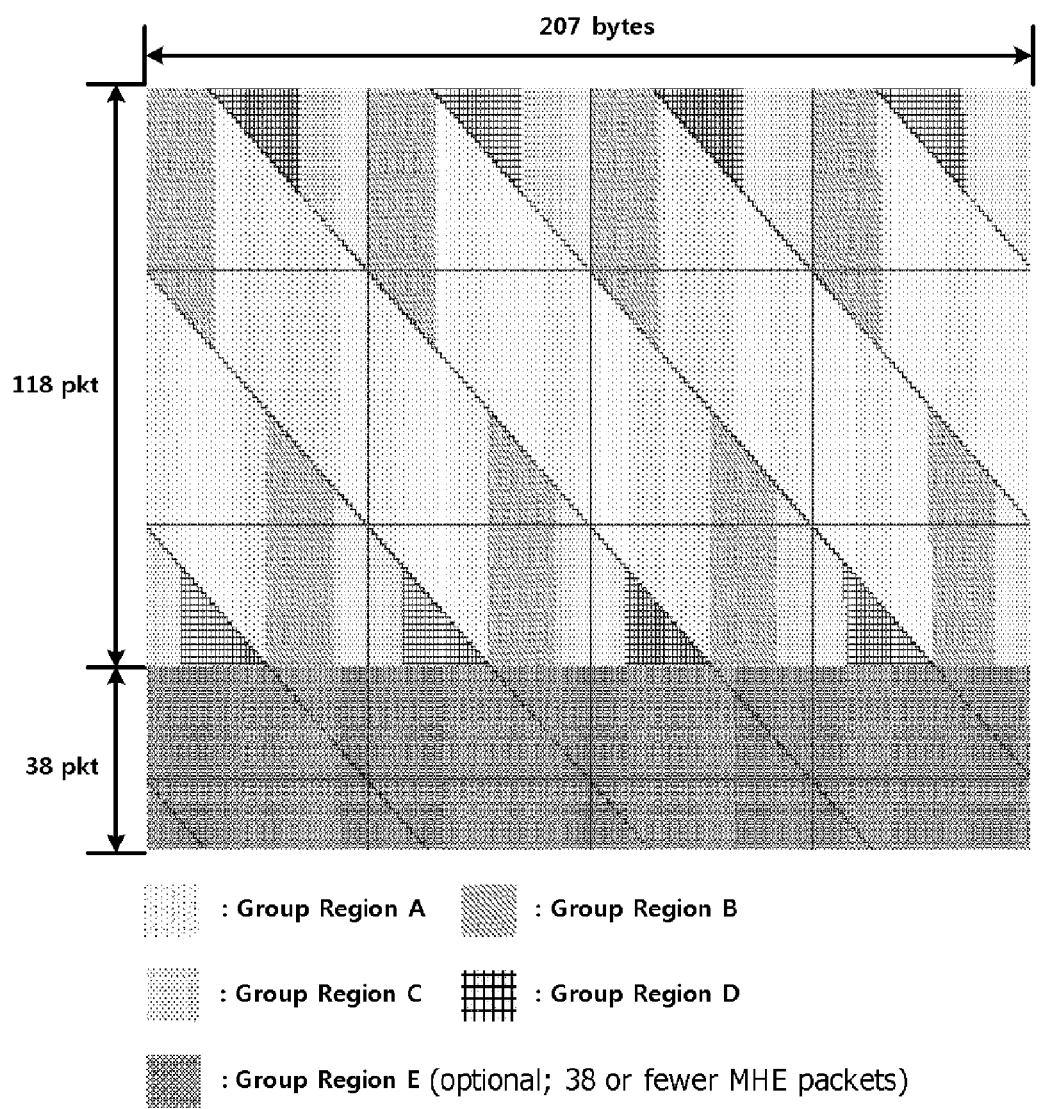
FIG. 12 illustrates a data group including (118+M) mobile service data packets according to an embodiment of the present invention.

FIG. 12 illustrates a data group including (118+M) mobile service data packets according to an embodiment of the present invention.

Referring to FIG. 12, the data group includes A, B, C, D and E regions. The data group is contained in a slot including 156 packets. That is, a predetermined number of packets contained in one slot form the data group, and such packets include mobile service data.

After 118 mobile service data packets fixed in the data group are interleaved, the data group is divided into A, B, C and D regions.

Meanwhile, a variable number (M) of mobile service data packets capable of being contained in the data group are contained in an additional region E. In the case where the data group in one slot is composed of 118 mobile service data packets, the E region can be defined as a specific region acquired when mobile service data packets are added to the region composed of only main service data packets. In other words, the E region may include a scalable number of mobile service data packets in one slot.

The mapping format of the mobile service data packets in the E region may be changed according to the intention of a designer. In other words, according to one embodiment of the present invention, when the number of mobile service data packets is 38 or less (i.e., M<=38) as shown in FIG. 12, a specific packet region in one slot remains empty in such a manner that the empty specific packet region can be used as a main service data packet region, and therefore mobile service data packets can be mapped to the remaining parts. According to another embodiment of the present invention, mobile service data packets can be mapped to the data group in such a manner that M scalable mobile service data packets contained in the E region are spaced apart from one another at intervals of a predetermined distance.

Also, the mobile service data being allocated to one group may be broadly divided into two types of mobile modes.

Herein, one of the mobile modes is referred to as a first mobile mode or a Core Mobile Mode (CMM), and the other mobile mode is referred to as a second mobile mode or an Extended Mobile Mode (EMM) or a Scalable Full Channel Mobile Mode (SFCMM). Furthermore, the first mobile mode and the second mobile mode may be collectively referred to as the Scalable Full Channel Mobile Mode (SFCMM). At this point, the mobile service data of the first mobile mode and the mobile service data of the second mobile mode may be encoded at a coding rate of 1/2, 1/3 , or 1/4.

The first mobile mode corresponds to a mode that is compatible with the conventional mobile broadcasting system. And, the second mobile mode may be either compatible or non-compatible with the conventional mobile service data. However, the second mobile mode corresponds to a mode that transmits data that cannot be recognized (or acknowledged) by the conventional mobile broadcasting system.

Only mobile service data of the first mobile mode may be allocated to one group, or only mobile service data of the second mobile mode may be allocated to the one group. Alternatively, both the mobile service data of the first mobile mode and the mobile service data of the second mobile mode may both be allocated to one group.

Figure 13:
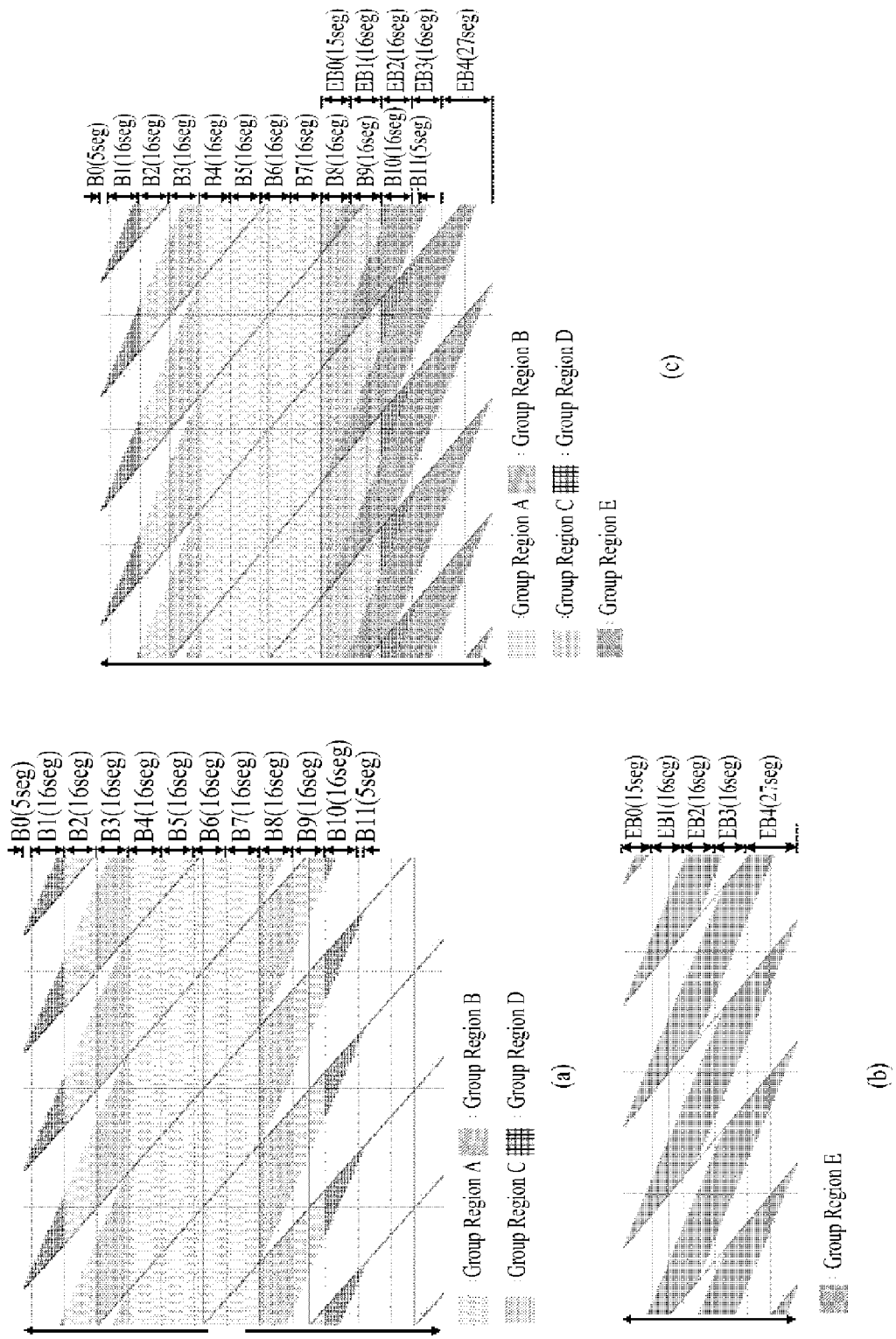
FIG. 13 illustrates a structure of a data group after being processed with interleaving according to the embodiment of the present invention, wherein the data group includes (118+M) number of mobile service data packets.

FIG. 13 illustrates a structure of a data group after being processed with interleaving according to the embodiment of the present invention, wherein the data group includes (118+M) number of mobile service data packets.

A data group structure shown in FIG. 13 is transmitted to the receiving system. More specifically, one data packet is data-interleaved and dispersed (or distributed) to a plurality of segments, thereby being transmitted to the receiving system. FIG. 13 shows an example of a single group distributed to 208 data segments. At this point, since one data packet of 207 bytes has the same data size of one data segment, a packet prior to being data-interleaved may be used as the concept of a packet.

(a) to (c) of FIG. 13 broadly illustrate the structure of a group in a segment domain according to an embodiment of the present invention. More specifically, FIG. 13 illustrates the structure of a group after being processed with data interleaving. In other words, one data packet is data interleaved, and the data-interleaved packet is distributed to a plurality of data segments, thereby being transmitted to the receiving system. (a) of FIG. 13 shows an example of regions A, B, C, and D being distributed to 170 data segments after being processed with data interleaving. (b) of FIG. 13 shows an example of region E being distributed to 90 data segments, when a region E exists within the group, after being processed with data interleaving. And, (c) of FIG. 13 shows an example of one group including regions A, B, C, D, and E being distributed to 208 data segments after being processed with data interleaving. At this point, since a data packet of 207 bytes has the same data size as one data segment, a packet prior to being data-interleaved may be used as the concept of a packet.

(a) of FIG. 13 illustrates an example of dividing a region corresponding to the first 118 data packets among a total of 156 data packets within a data group after being processed with data-interleaving into 12 DATA blocks (MH blocks B0 to B11). Also, according to the embodiment of the present invention, each of the DATA blocks B1 to B10 has the length of 16 segments, and DATA block B0 and DATA block B11 each has the length of 5 segments.

Herein, when it is assumed that one group includes at least regions A, B, C, and D, depending upon the characteristics of each DATA block within the group, each DATA block may be included in any one of region A to region D. At this point, according to the embodiment of the present invention, and depending upon the level (or degree) of interference of the main service data, each DATA block is included in any one region among region A to region D.

Herein, the group is divided into multiple regions so that each region can be used for a different purpose. More specifically, this is because a region having no interference from the main service data may yield a more robust data receiving performance (or capability) that a region having interference from the main service data. Also, when a system transmitting data by inserting known data, which are pre-known in accordance with an agreement between the receiving system and the transmitting system, in a group is applied, known data having a predetermined length may be periodically inserted in a region where there is no interference from the main service data (i.e., in a region that is not mixed with the main service data). However, in a region having interference from the main service data, due to the interference of the main service data, it is difficult to periodically insert known data, and it is also difficult to insert consecutively long known data.

DATA block B4 to DATA block B7 within the group shown in (a) of FIG. 13 collectively correspond to a region having no interference from the main service data. According to the embodiment of the present invention, the region including DATA block B4 to DATA block B7 will be referred to as region A (=B4+B5+B6+B7).

DATA block B3 and DATA block B8 within the group shown in (a) of FIG. 13 collectively correspond to a region having little interference from the main service data. According to the embodiment of the present invention, the region including DATA block B3 and DATA block B8 will be referred to as region B (=B3+B8).

DATA block B2 and DATA block B9 within the group shown in (a) of FIG. 13 collectively correspond to a region having a level of interference from the main service data greater than that of region B. According to the embodiment of the present invention, the region including DATA block B2 and DATA block B9 will be referred to as region C (=B2+B9).

DATA block B0 to DATA block B1 and DATA block B10 to DATA block B11 within the group shown in (a) of FIG. 13 collectively correspond to a region having a level of interference from the main service data greater than that of region C. According to the embodiment of the present invention, the region including DATA block B0 to DATA block B1 and DATA block B10 to DATA block B11 will be referred to as region D (=B0+B1+B10+B11).

(b) of FIG. 13 shows an example of dividing a region, which corresponds to the last 38 data packets among the total of 156 data packets within a group of a data structure after being processed with data interleaving, into 5 extended DATA blocks (extended MH blocks EB0 to EB4). Also, according to the embodiment of the present invention, each of the extended DATA blocks EB1 to EB3 has the length of 16 segments. Additionally, according to the embodiment of the present invention, the extended DATA block EB0 has the length of 15 segments, and the extended DATA block EB4 has the length of 27 segments.

Furthermore, according to the embodiment of the present invention, the region including all of the extended DATA blocks EB0 to EB4 shown in (b) of FIG. 13 will be referred to as region E (=EB0+EB1+EB2+EB3+EB4).

(c) of FIG. 13 is identical to an example of overlapping (a) of FIG. 13 and (b) of FIG. 13. Herein, the position of the first segment of the extended DATA block EB0 corresponds to the same segment as the second segment of DATA block B8. And, with the exception for the first segment of DATA block B8, all of the remaining segments respectively overlap with all of the segments of the extended DATA block EB0. Also, all segments of DATA block B9 respectively overlap with all segments of the extended DATA block EB1, and all segments of DATA block B10 respectively overlap with all segments of the extended DATA block EB2. Finally, all segments of DATA block B11 overlap with the first 5 segments of the extended DATA block EB3.

In the above-described example, even if the positions overlap in the same segment, all DATA blocks include only the data corresponding to the first 118 data packets of the data group prior to being processed with data-interleaving, and all extended DATA blocks include only the data corresponding to the last 38 data packets of the data group prior to being processed with data-interleaving.

The mobile service data being allocated to one data group include mobile service data of both the first mobile mode and the second mobile mode.

The above-described alignment and positioning of the data blocks and the extended data blocks are merely exemplary. And, accordingly, the position and number of segments being included in the data blocks and the extended data blocks may vary within a range that does not influence or deviate from the technical aspects and characteristics of the present invention.

Figure 14:
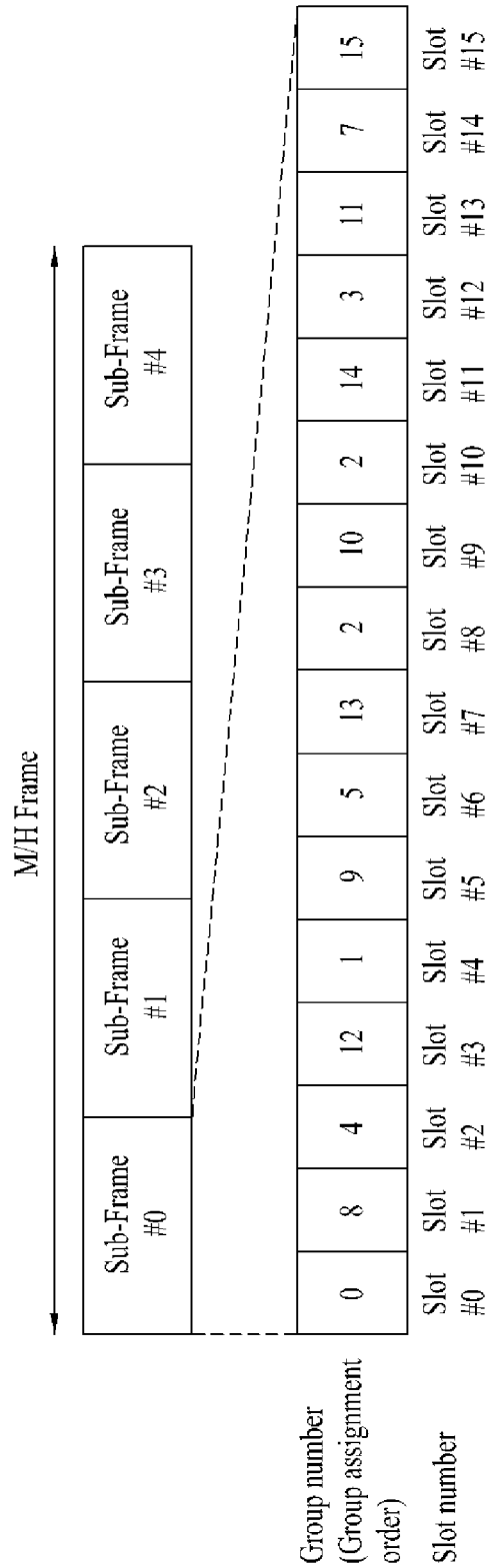
FIG. 14 illustrates an exemplary assignment order of data groups being assigned to one of 5 sub-frames, wherein the 5 sub-frames configure an M/H frame.

FIG. 14 illustrates an exemplary assignment order of data groups being assigned to one of 5 sub-frames, wherein the 5 sub-frames configure an M/H frame.

For example, the method of assigning data groups may be identically applied to all M/H frames or differently applied to each M/H frame. Furthermore, the method of assigning data groups may be identically applied to all sub-frames or differently applied to each sub-frame. At this point, when it is assumed that the data groups are assigned using the same method in all sub-frames of the corresponding M/H frame, the total number of data groups being assigned to an M/H frame is equal to a multiple of '5'.

According to the embodiment of the present invention, a plurality of consecutive data groups is assigned to be spaced as far apart from one another as possible within the M/H frame. Thus, the system can be capable of responding promptly and effectively to any burst error that may occur within a sub-frame.

For example, when it is assumed that 3 data groups are assigned to a sub-frame, the data groups are assigned to a 1st slot (Slot #0), a 5th slot (Slot #4), and a 9th slot (Slot #8) in the sub-frame, respectively. FIG. 9 illustrates an example of assigning 16 data groups in one sub-frame using the above-described pattern (or rule). In other words, each data group is serially assigned to 16 slots corresponding to the following numbers: 0, 8, 4, 12, 1, 9, 5, 13, 2, 10, 6, 14, 3, 11, 7, and 15. Equation 2 below shows the above-described rule (or pattern) for assigning data groups in a sub-frame.

[Equation 2]

$$j = (4i + 0) \bmod 16$$
$$\text{Herein,} \quad \begin{aligned} 0 &= 0 \text{ if } i < 4, \\ 0 &= 2 \text{ else if } i < 8, \\ 0 &= 1 \text{ else if } i < 12, \\ 0 &= 3 \text{ else.} \end{aligned}$$

Herein, j indicates the slot number within a sub-frame. The value of j may range from 0 to 15. Also, value of i indicates the data group number. The value of i may range from 0 to 15.

In the present invention, a collection of data groups included in an M/H frame will be referred to as a "parade". Based upon the RS frame mode, the parade transmits data of at least one specific RS frame.

The mobile service data within one RS frame may be assigned either to all of regions A/B/C/D/E within the corresponding data group, or to at least one of regions A/B/C/D/E. In the embodiment of the present invention, the mobile service data within one RS frame may be assigned either to all of regions A/B/C/D/E, or to at least one of regions A/B and regions C/D/E. If the mobile service data are assigned to the latter case (i.e., one of regions A/B and regions C/D/E), the RS frame being assigned to regions A/B and the RS frame being assigned to regions C/D/E within the corresponding data group are different from one another.

In the description of the present invention, the RS frame being assigned to regions A/B within the corresponding data group will be referred to as a "primary RS frame", and the RS frame being assigned to regions C/D/E within the corresponding data group will be referred to as a "secondary RS frame", for simplicity. Also, the primary RS frame and the secondary RS frame form (or configure) one parade. More specifically, when the mobile service data within one RS frame are assigned either to all of regions A/B/C/D/E within the corresponding data group, one parade transmits one RS frame. In this case, also the RS frame will be referred to as a "primary RS frame". Conversely, when the mobile service data within one RS frame are assigned either to at least one of regions A/B and regions C/D/E, one parade may transmit up to 2 RS frames.

More specifically, the RS frame mode indicates whether a parade transmits one RS frame, or whether the parade transmits two RS frames. Table 2 below shows an example of the RS frame mode.

TABLE 2

| RS frame mode (2 bits) | Description |
| --- | --- |
| 00 | There is only one primary RS frame for all group regions(A, B, C, D, E) |
| 01 | There are two separate RS frames. Primary RS frame for group regions A and B Secondary RS frame for group regions C, D and E |
| 10 | Reserved |
| 11 | Reserved |

Table 2 illustrates an example of allocating 2 bits in order to indicate the RS frame mode. For example, referring to Table 2, when the RS frame mode value is equal to '00', this indicates that one parade transmits one RS frame. And, when the RS frame mode value is equal to '01', this indicates that one parade transmits two RS frames, i.e., the primary RS frame and the secondary RS frame. More specifically, when the RS frame mode value is equal to '01', data of the primary RS frame for regions A/B are assigned and transmitted to regions A/B of the corresponding data group. Similarly, data of the secondary RS frame for regions C/D/E are assigned and transmitted to regions C/D/E of the corresponding data group.

As described in the assignment of data groups, the parades are also assigned to be spaced as far apart from one another as possible within the sub-frame. Thus, the system can be capable of responding promptly and effectively to any burst error that may occur within a sub-frame.

Furthermore, the method of assigning parades may be identically applied to all sub-frames or differently applied to each sub-frame. According to the embodiment of the present invention, the parades may be assigned differently for each M/H frame and identically for all sub-frames within an M/H frame. More specifically, the M/H frame structure may vary by M/H frame units. Thus, an ensemble rate may be adjusted on a more frequent and flexible basis.

FIG. 15 illustrates a method for transmitting a primary or secondary ensemble/RS frame through an A, B, C, D, or E region in a data group according to an embodiment of the present invention.

In the case of parade type 1 or 2, a data group has no E region. Accordingly, a conventional mobile broadcast receiver can process a primary or secondary ensemble/RS frame of parade type 1 or 2.

In the case of parade types 3 to 8, a data group has an E region. Since data groups of parade types 3 to 8 each have an E region, a Region 'E' indicator is set to "1".

In the case of parade type 3, a primary ensemble/RS frame is transmitted through A, B, C, and D regions and a secondary ensemble/RS frame is transmitted through an E region. In this case, an RS frame mode may be set to '00'.

In the case of parade type 4, a primary ensemble/RS frame is transmitted through A and B regions and a secondary ensemble/RS frame is transmitted through C, D, E regions. In this case, an RS frame mode may be set to '01'.

In the case of parade type 5, a primary ensemble/RS frame is transmitted through A, B, C, D, and E regions. In this case, an RS frame mode may be set to '01'

In the case of parade type 6, a primary ensemble/RS frame is transmitted through A, B, C, and D regions and a secondary ensemble/RS frame is transmitted through an E region. In this case, an RS frame mode may be set to '00'. All regions of a data group of parade type 6 are used for mobile service data. To indicate this, a full channel indicator is set to '1'.

In the case of parade type 7, a primary ensemble/RS frame is transmitted through A and B regions and a secondary ensemble/RS frame is transmitted through C, D, and E regions. In this case, an RS frame mode may be set to '01'. All regions of a data group of parade type 7 are used for mobile service data. To indicate this, a full channel indicator is set to 1.

In the case of parade type 8, a primary ensemble/RS frame is transmitted through A, B, C, D, and E regions. In this case, an RS frame mode may be set to '00'. All regions of a data group of parade type 8 are used for mobile service data. To indicate this, a full channel indicator is set to 1.

The conventional mobile broadcast receiver can process ensemble/RS frames transmitted through regions that are underlined in FIG. 15. However, the conventional mobile broadcast receiver cannot process ensemble/RS frames transmitted through regions that are underlined in FIG. 15 and cannot provide a corresponding service although it can receive the ensemble/RS frames.

The set bit value of the RS frame mode and the indicator setting of each parade type described above are purely exemplary and the present invention is not limited to this example.

Figure 16:
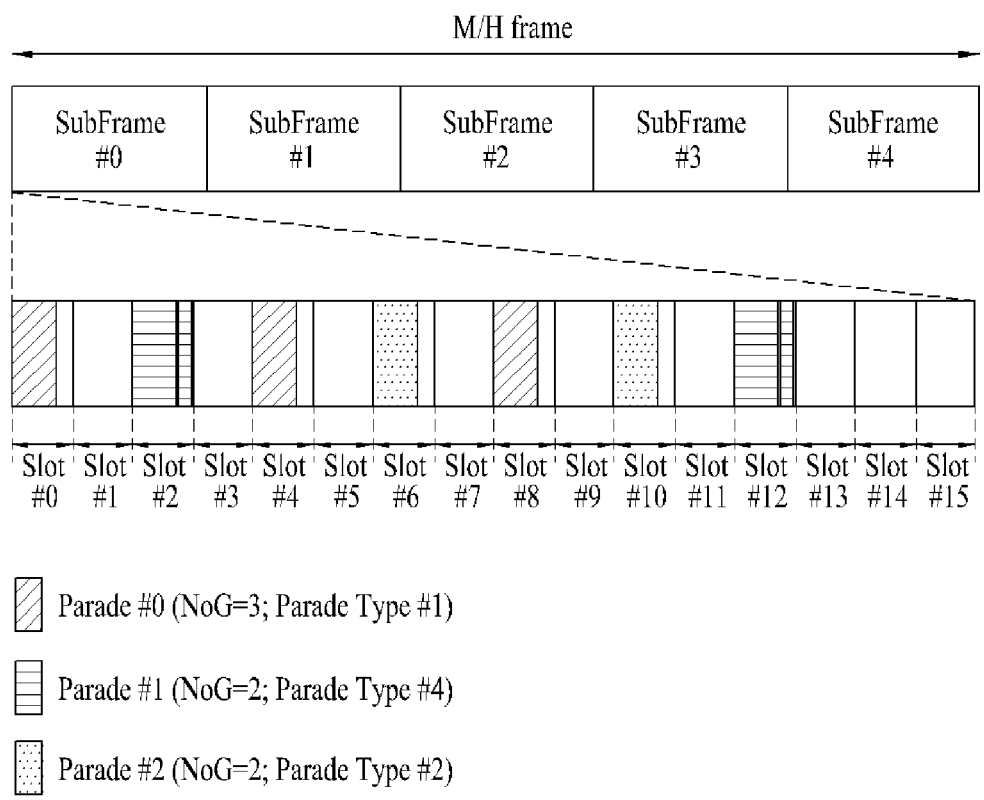
FIG. 16 illustrates an example of transmitting 3 parades (Parade #0, Parade #1, and Parade #2) to an M/H frame.

FIG. 16 illustrates an example of transmitting 3 parades (Parade #0, Parade #1, and Parade #2) to an M/H frame. More specifically, FIG. 16 illustrates an example of transmitting parades included in one of 5 sub-frames, wherein the 5 sub-frames configure one M/H frame.

When the 1st parade (Parade #0) includes 3 data groups for each sub-frame, the positions of each data groups within the sub-frames may be obtained by substituting values '0' to '2' for i in Equation 2. More specifically, the data groups of the 1st parade (Parade #0) are sequentially assigned to the 1st, 5th, and 9th slots (Slot #0, Slot #4, and Slot #8) within the sub-frame. Also, when the 2nd parade includes 2 data groups for each sub-frame, the positions of each data groups within the sub-frames may be obtained by substituting values '3' and '4' for i in Equation 2.

More specifically, the data groups of the 2nd parade (Parade #1) are sequentially assigned to the 2nd and 12th slots (Slot #3 and Slot #11) within the sub-frame.

Finally, when the 3rd parade includes 2 data groups for each sub-frame, the positions of each data groups within the sub-frames may be obtained by substituting values '5' and '6' for i in Equation 1. More specifically, the data groups of the 3rd parade (Parade #2) are sequentially assigned to the 7th and 11th slots (Slot #6 and Slot #10) within the sub-frame.

As described above, data groups of multiple parades may be assigned to a single MAI frame, and, in each sub-frame, the data groups are serially allocated to a group space having 4 slots from left to right. Therefore, a number of groups of one parade per sub-frame (NOG) may correspond to any one integer from '1' to '8'. Herein, since one M/H frame includes 5 sub-frames, the total number of data groups within a parade that can be allocated to an M/H frame may correspond to any one multiple of '5' ranging from '5' to '40'.

Parade #1 is a parade of parade type 4 and includes an E region in its data group. From this, it can be seen that a parade including a CMM data group and a parade including an SFCMM data group may be multiplexed and transmitted within one subframe.

Figure 17:
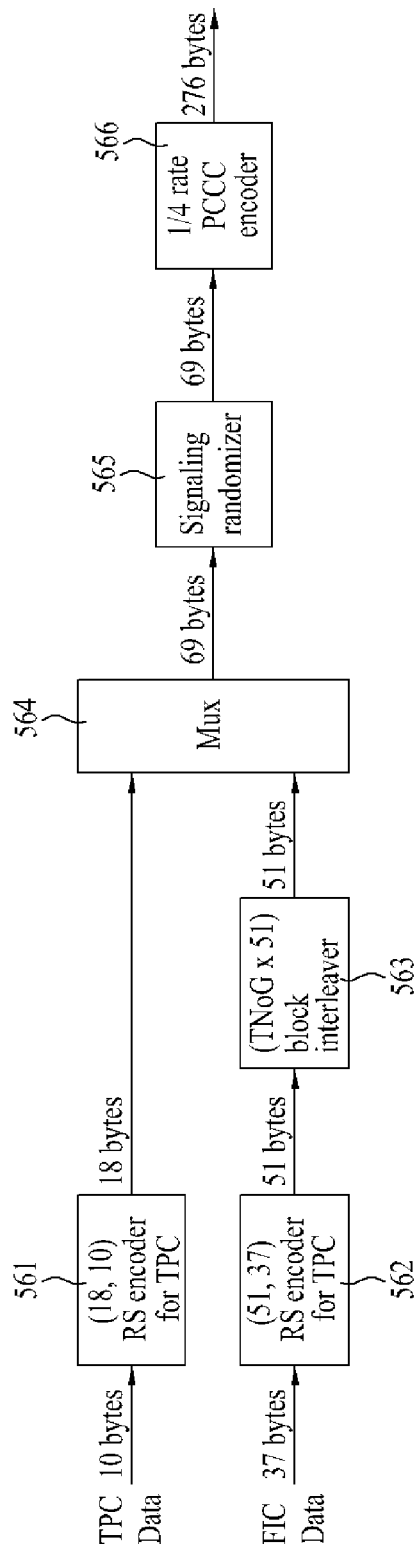
FIG. 17 illustrates a detailed block diagram of the signaling encoder according to the present invention.

FIG. 17 illustrates a detailed block diagram of the signaling encoder according to the present invention.

Referring to FIG. 17, the signaling encoder includes a TPC encoder 561, an FIC encoder 562, a block interleaver 563, a multiplexer 564, a signaling randomizer 565, and a PCCC (Parallel Concatenated Convolutional Code) encoder 566.

The TPC encoder 561 receives 10-bytes of TPC data and performs (18,10)-RS encoding on the 10-bytes of TPC data, thereby adding 8 bytes of RS parity data to the 10 bytes of TPC data. The 18 bytes of RS-encoded TPC data are outputted to the multiplexer 564.

The FIC encoder 562 receives 37-bytes of FIC data and performs (51,37)-RS encoding on the 37-bytes of FIC data, thereby adding 14 bytes of RS parity data to the 37 bytes of FIC data. Thereafter, the 51 bytes of RS-encoded FIC data are inputted to the block interleaver 563, thereby being interleaved in predetermined block units. Herein, the block interleaver 563 corresponds to a variable length block interleaver. The block interleaver 563 interleaves the FIC data within each sub-frame in TNoG(column)×51(row) block units and then outputs the interleaved data to the multiplexer 564. Herein, the TNoG corresponds to the total number of data groups being assigned to a sub-frame. The block interleaver 563 is synchronized with the first set of FIC data in each sub-frame.

The block interleaver 563 writes 51 bytes of incoming (or inputted) RS codewords in a row direction (i.e., row-by-row) and left-to-right and up-to-down directions and reads 51 bytes of RS codewords in a column direction (i.e., column-by-column) and left-to-right and up-to-down directions, thereby outputting the RS codewords.

The multiplexer 564 multiplexes the RS-encoded TPC data from the TPC encoder 561 and the block-interleaved FIC data from the block interleaver 563 along a time axis. Then, the multiplexer 564 outputs 69 bytes of the multiplexed data to the signaling randomizer 565. The signaling randomizer 565 randomizes the multiplexed data and outputs the randomized data to the iterative turbo encoder 566. The signaling randomizer 565 may use the same generator polynomial of the randomizer used for mobile service data. Also, initialization occurs in each data group.

The PCCC encoder 566 corresponds to an inner encoder performing iterative turbo encoding in a PCCC method on the randomized data (i.e., signaling information data).

For example, if the PCCC encoder 566 performs encoding of data at a coding rate of 1/4, 69 bytes applied to the PCCC encoder 566 are extended to 276 bytes by the iterative turbo-encoding process, such that the PCCC encoder 566 outputs the resultant 276 bytes. The 276 bytes generated from the PCCC encoder 566 are transferred to the group formatter, such that they are inserted into a signaling information area of a corresponding data group.

Figure 18:
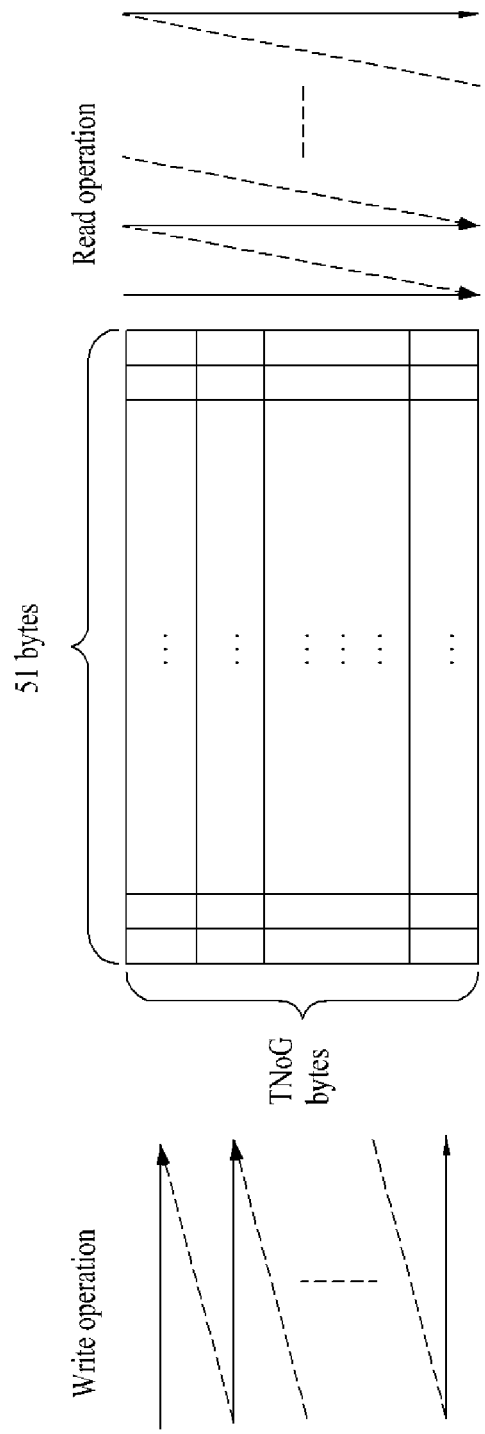
FIG. 18 illustrates how a block interleaver in a signaling encoder operates to interleave FIC data according to an embodiment of the present invention.

FIG. 18 illustrates how a block interleaver in a signaling encoder operates to interleave FIC data according to an embodiment of the present invention.

A variable length Block interleaver consisting of 51 columns (of bytes) and a number of rows equal to TNoG shall be employed to interleave the RS encoded FIC data within each M/H Sub-Frame. The Block interleaver shall write the incoming RS codewords of 51 bytes row-by-row from left to right and top-to-bottom and shall output the data in units of 51 bytes by reading column by column from top-to-bottom and left-to-right, as shown FIG. 18.

The TNoG shall be identical for all Sub-Frames in an M/H Frame.

The first byte in the FIC Block interleaver shall be the first FIC data byte of each Sub-Frame. The FIC block interleaver interleaves one block of FIC data across each subframe.

FIG. 19 illustrates a syntax structure of an FIC chunk header according to an embodiment of the present invention.

Herein, the FIC chunk header signals a non-backward compatible major protocol version change in a corresponding FIC chunk and also signals a backward compatible minor protocol version change. Furthermore, the FIC chunk header also signals the length for an extension of an FIC chunk header, the length for an extension of an ensemble loop header, and the length for an extension of a mobile service loop that can be generated by a minor protocol version change.

According to an embodiment of the present invention, a receiver (or receiving system) that can adopt the corresponding minor protocol version change may process the corresponding extension field, whereas a legacy (or conventional) receiver that cannot adopt the corresponding minor protocol version change may skip the corresponding extension field by using each of the corresponding length information. For example, in case of a receiving system that can accept the corresponding minor protocol version change, the directions given in the corresponding extension field may be known. Furthermore, the receiving system may perform operations in accordance with the directions given in the corresponding extension field.

According to an embodiment of the present invention, a minor protocol version change in the FIC chunk is performed by inserting additional fields at the respective end portion of the FIC chunk header, the ensemble loop header, and the mobile service loop included in the previous minor protocol version FIC chunk. According to an embodiment of the present invention, in any other case, or when the length of the additional fields cannot be expressed (or indicated) by each extension length within the FIC chunk header, or when a specific field within the FIC chunk payload is missing (or cannot be found), or when the number of bits being assigned to the corresponding field or the definition of the corresponding field is changed (or altered), the major protocol version of the corresponding FIC chunk is updated.

Also, the FIC chunk header signals whether the data of a corresponding FIC chunk payload carry mapping information between an ensemble and a mobile service within the current M/H frame, or whether the data of a corresponding FIC chink payload carry mapping information between an ensemble and a mobile service within the next M/H frame. Furthermore, the FIC chunk header also signals the number of transport stream IDs of a mobile service through which the current FIC chunk is being transmitted and the number of ensembles being transmitted through the corresponding mobile service.

Accordingly, for this, the FIC chunk header may include an FIC_major_protocol_version field, an FIC_minor_protocol_version field, an FIC_chunk_header_extension_length field, an ensemble_loop_header_extension_length field, an M/H_service_loop_extension_length field, a current_next_indicator field, a transport_stream_id field, a num_MH_1.1_ensembles field and a num_ensembles field.

The FIC_major_protocol_version field corresponds to a 2-bit unsigned integer field that represents the major version level of a FIC chunk syntax. A change in the major version level shall indicate a change in a non-backward-compatible level. When the FIC_major_protocol_version field is updated, legacy (or conventional) receivers, which can process the prior major protocol version of an FIC chunk protocol, shall avoid processing the FIC chunk.

The FIC_minor_protocol_version field corresponds to a 3-bit unsigned integer field that represents the minor version level of an FIC chunk syntax. When it is assumed that the major version level remains the same, a change in the minor version level shall indicate a change in a backward-compatible level. More specifically, when the FIC_minor_protocol_version field is updated, legacy (or conventional) receivers, which can process the same major version of the FIC chunk protocol, may process a portion of the FIC chunk.

The minor protocol versioning is used so that a conventional mobile receiving device can ignore the SFCMM Ensemble/Service portion of the FIC-Chunk data structure, and avoid any malfunction due to the presence of extended data.

The FIC_Chunk_header_extension_length field corresponds to a 3-bit unsigned integer field identifying the length of FIC chunk header extension bytes, which are generated by the minor protocol version update of the corresponding FIC chunk. Herein, the extension bytes are appended (or added) at the end of the corresponding FIC chunk header.

In an embodiment of the present invention, when an FIC_Chunk_header_extension_length field is set to '001', this indicates that a 1-byte extension is present in the FIC chunk header. In this case, the conventional mobile broadcast receiver (i.e., the CMM receiving device) skips the extended field in the FIC chunk header according to the value of the FIC_Chunk_header_extension_length field. For example, since a num_MH1.1_ensembles field in the FIC chunk header is a field added to the FIC chunk header when the FIC chunk header is extended, the conventional mobile broadcast receiver need not process this field. In this case, the conventional mobile broadcast receiver processes only the CMM ensemble or service related fields among the fields of the FIC chunk payload and may skip processing the SFCMM ensemble or service related fields added to the FIC chunk payload That is, through the FIC_Chunk_header_extension_length field value of '001', the conventional mobile broadcast receiver determines that it should skip one byte prior to the num_ensembles field and a new mobile broadcast receiver determines that one byte field to be read by the new mobile broadcast receiver is present prior to the num_ensembles field.

The ensemble_header_extension_length field corresponds to a 3-bit unsigned integer field identifying the length of the ensemble header extension bytes, which are generated by the minor protocol version update of the corresponding FIC chunk. Herein, the extension bytes are appended (or added) at the end of the corresponding ensemble loop header.

Also, the M/H_service_loop_extension_length field corresponds to a 4-bit unsigned integer field identifying the length of the ensemble header extension bytes, which are generated by the minor protocol version update of the M/H service loop. Herein, the extension bytes are appended (or added) at the end of the corresponding M/H service loop.

For example, it is assumed that the FIC chunk includes 2 ensembles (i.e., ensemble 0 and ensemble 1), more specifically, it is assumed that two mobile services are transmitted through ensemble 0, and one mobile service is transmitted through ensemble 1. At this point, when the minor protocol version of the FIC chunk is changed, and the FIC chunk header is expanded by 1 byte, the FIC_chunk_header_extension_length field is marked as '001'. In this case, a 1-byte expansion field (i.e., FIC_Chunk_header_extension_bytes field) is added at the end of the FIC chunk header. Also, the legacy receiver skips the 1-byte expansion field, which is added at the end of the FIC chunk header, without processing the corresponding expansion field.

Additionally, when the ensemble loop header within the FIC chunk is expanded by 2 bytes, the ensemble_loop_header_extension_length field is marked as '010'. In this case, a 2-byte expansion field (i.e., Ensemble_loop_header_extension_bytes field) is respectively added at the end of the ensemble 0 loop header and at the end of the ensemble 1 loop header. Also, the legacy receiver skips the 2-byte expansion fields, which are respectively added at the end of the ensemble 0 loop header and at the end of the ensemble 1 loop header, without processing the corresponding 2-byte expansion fields.

Furthermore, when the mobile service loop of the FIC chunk is expanded by 1 byte, the M/H_service_loop_extension_length field is marked as '001'. In this case, a 1-byte expansion field (i.e., M/H_service_loop_extension_bytes field) is respectively added at the end of 2 mobile service loops being transmitted through ensemble 0 loop and at the end of 1 mobile service loop being transmitted through the ensemble 1 loop. And, the legacy receiver skips the 1-byte expansion fields, which are respectively added at the end of 2 mobile service loops being transmitted through ensemble 0 loop and at the end of 1 mobile service loop being transmitted through the ensemble 1 loop, without processing the corresponding 1-byte expansion fields.

As described above, when the FIC_minor_protocol_version field is changed, a legacy (or conventional) receiver (i.e., a receiver that cannot adopt the minor protocol version change in the corresponding FIC chunk) processes the fields apart from the extension field. Thereafter, the legacy receiver uses the FIC_chunk_header_extension_length field, the ensemble_loop_header_extension_length field, and the M/H_service_loop_extension_length field, so as to skip the corresponding expansion fields without processing the corresponding fields. When using a receiving system that can adopt the corresponding minor protocol version change of the FIC chunk, each length field is used to process even the corresponding expansion field.

The current_next_indicator field corresponds to a 1-bit indicator, which, when set to '1', indicates that the corresponding FIC chunk is currently applicable. Alternatively, when the current_next_indicator field is set to '0', the current_next_indicator field indicates that the corresponding FIC chunk will be applicable for the next M/H frame. Herein, when the current_next_indicator field is set to '0', the most recent version of the FIC chunk being transmitted with the current_next_indicator field set to '1' shall be currently applicable. More specifically, when the current_next_indicator field value is set to '1', this indicates that the corresponding FIC chunk transmits the signaling data of the current M/H frame. Further, when the current_next_indicator field value is set to '0', this indicates that the corresponding FIC chunk transmits the signaling data of the next M/H frame. When reconfiguration occurs, wherein the mapping information between the ensemble within the current M/H frame and the mobile service differs from the ensemble within the next M/H frame and the mobile service, the M/H frame prior to reconfiguration is referred to as the current M/H frame, and the M/H frame following reconfiguration is referred to as the next M/H frame.

The transport_stream_id field corresponds to a 16-bit unsigned integer number field, which serves as a label for identifying the corresponding M/H broadcast. The value of the corresponding transport_stream_id field shall be equal to the value of the transport_stream_id field included in the program association table (PAT) within the MPEG-2 transport stream of a main ATSC broadcast.

The num_MH1.1_ensembles field corresponds to an 8-bit unsigned integer field, the value of which shall equal the number of SFCMM Ensembles carried through this digital Broadcast that are not available to CMM receiver devices, including the SFCMM Ensembles where the value of the PRC for the corresponding M/H Parades is greater than 0 and that do not have any M/H Groups in the M/H Frame to which this FIC-Chunk refers. The conventional mobile broadcast receiver may not process this field and skip it. The term of 'MH1.1' is defined same as SFCMM.

The num_ensembles field corresponds to an 8-bit unsigned integer field, which indicates the number of CMM ensembles carried through the corresponding physical transmission channel.

FIG. 20 illustrates an exemplary syntax structure of an FIC chunk payload according to an embodiment of the present invention. For each ensemble and MH1.1 ensemble corresponding to the num_ensembles field and num_MH1.1_ensembles field value within the FIC chunk header of FIG. 19, the FIC chunk payload includes configuration information of each ensemble/MH1.1 ensemble and information on mobile services being transmitted through each ensemble.

The FIC chunk payload consists of an ensemble loop and a mobile service loop below the ensemble loop. The FIC chunk payload enables the receiver to determine through which ensemble a requested (or desired) mobile service is being transmitted. (This process is performed via mapping between the ensemble_id field and the M/H_service_id field.) Thus, the receiver may receive RS frames belonging to the corresponding ensemble.

In order to do so, the ensemble loop of the FIC chunk payload may include an ensemble_id field, an ensemble_protocol_version field, an SLT_ensemble_indicator field, a GAT_ensemble_indicator field, an MH_service_signaling_channel_version field, and a num_M/H_services field, which are collectively repeated as many times as the num_ensembles field value. The mobile service loop may include an MH_service_id field, a service_span field, an MH_service_status field, and an SP_indicator field, which are collectively repeated as many times as the num_M/H_services field.

The ensemble_id field corresponds to an 8-bit unsigned integer field, which indicates a unique identifier of the corresponding ensemble. For example, the ensemble_id field may be assigned with values within the range '0x00' to '0x7F'. The ensemble_id field group (or associate) the mobile services with the respective ensemble. Herein, it is preferable that the value of the ensemble_id field is derived from the parade_id field carried (or transmitted) through the TPC data. If the corresponding ensemble is transmitted through a primary RS frame, the most significant bit is set to '0', and the remaining least significant bits are used as the parade_id field value of the corresponding parade. Meanwhile, if the corresponding ensemble is transmitted through a secondary RS frame, the most significant bit is set to '0', and the remaining least significant bits are used as the parade_id field value of the corresponding parade.

The ensemble_protocol_version field corresponds to a 5-bit field, which specifies a version of the corresponding ensemble structure.

The SLT_ensemble_indicator field is a 1-bit field, which indicates whether or not the SLT is being transmitted to the service signaling channel of the corresponding ensemble. For example, when the SLT_ensemble_indicator field value is equal to '1', this may indicate that the SLT is being transmitted to the service signaling channel. On the other hand, when the SLT_ensemble_indicator field value is equal to '0', this may indicate that the SLT is not being transmitted.

The GAT_ensemble_indicator field is also a 1-bit field, which indicates whether or not the GAT is being transmitted to the service signaling channel of the corresponding ensemble. For example, when the GAT_ensemble_indicator field value is equal to '1', this may indicate that the GAT is being transmitted to the service signaling channel. On the other hand, when the GAT_ensemble_indicator field value is equal to '0', this may indicate that the GAT is not being transmitted.

The MH_service_signaling_channel_version field corresponds to a 5-bit field, which indicates a version number of the service signaling channel of the corresponding ensemble.

The num_M/H_services field corresponds to an 8-bit unsigned integer field, which represents the number of mobile (i.e., M/H) services carried through the corresponding M/H ensemble.

For example, when the minor protocol version within the FIC chunk header is changed, and when an extension field is added to the ensemble loop header, the corresponding extension field is added immediately after the num_M/H_services field. According to anther embodiment of the present invention, if the num_M/H_services field is included in the mobile service loop, the corresponding extension field that is to be added in the ensemble loop header is added immediately after the M/H_service_configuration_version field.

The M/H_service_id field of the mobile service loop corresponds to a 16-bit unsigned integer number, which identifies the corresponding M/H service. The value (or number) of the M/H_service_id field shall be unique within the mobile (M/H) broadcast. When an M/H service has components in multiple M/H ensembles, the set of IP streams corresponding to the service in each ensemble shall be treated as a separate service for signaling purposes, with the exception that the entries for the corresponding services in the FIC shall all have the same M/H_service_id field value. Thus, the same M/H_service_id field value may appear in more than one num_ensembles loop. And, accordingly, the M/H_service_id field shall represent the overall combined service, thereby maintaining the uniqueness of the M/H_service_id field value.

The multi_ensemble_service field is a two-bit enumerated field that shall identify whether this M/H Service is carried across more than one M/H Ensemble. Also, this field identifies whether the M/H Service can be rendered meaningfully with only the portion of the M/H Service carried through this M/H Ensemble.

The MH_service_status field is a two-bit enumerated field that shall identify the status of this M/H Service. The most significant bit indicates whether this M/H Service is active (when set to 1) or inactive (when set to 0) and the least significant bit indicates whether this M/H Service is hidden (when set to 1) or not (when set to 0).

The SP_indicator field is a one-bit field that indicates, when set, service protection is applied to at least one of the components needed to provide a meaningful presentation of this M/H Service.

The FIC_chunk_stuffing field indicates that stuffing may exist in an FIC-Chunk. The number of stuffing bytes shall be the minimum number needed to make the length of the FIC-Chunk evenly divisible by 35.

Fields including SFCMM ensemble related information are added to an FIC payload included in the extended signaling data. The descriptions of these fields are similar to those of the fields described above.

Figure 21:
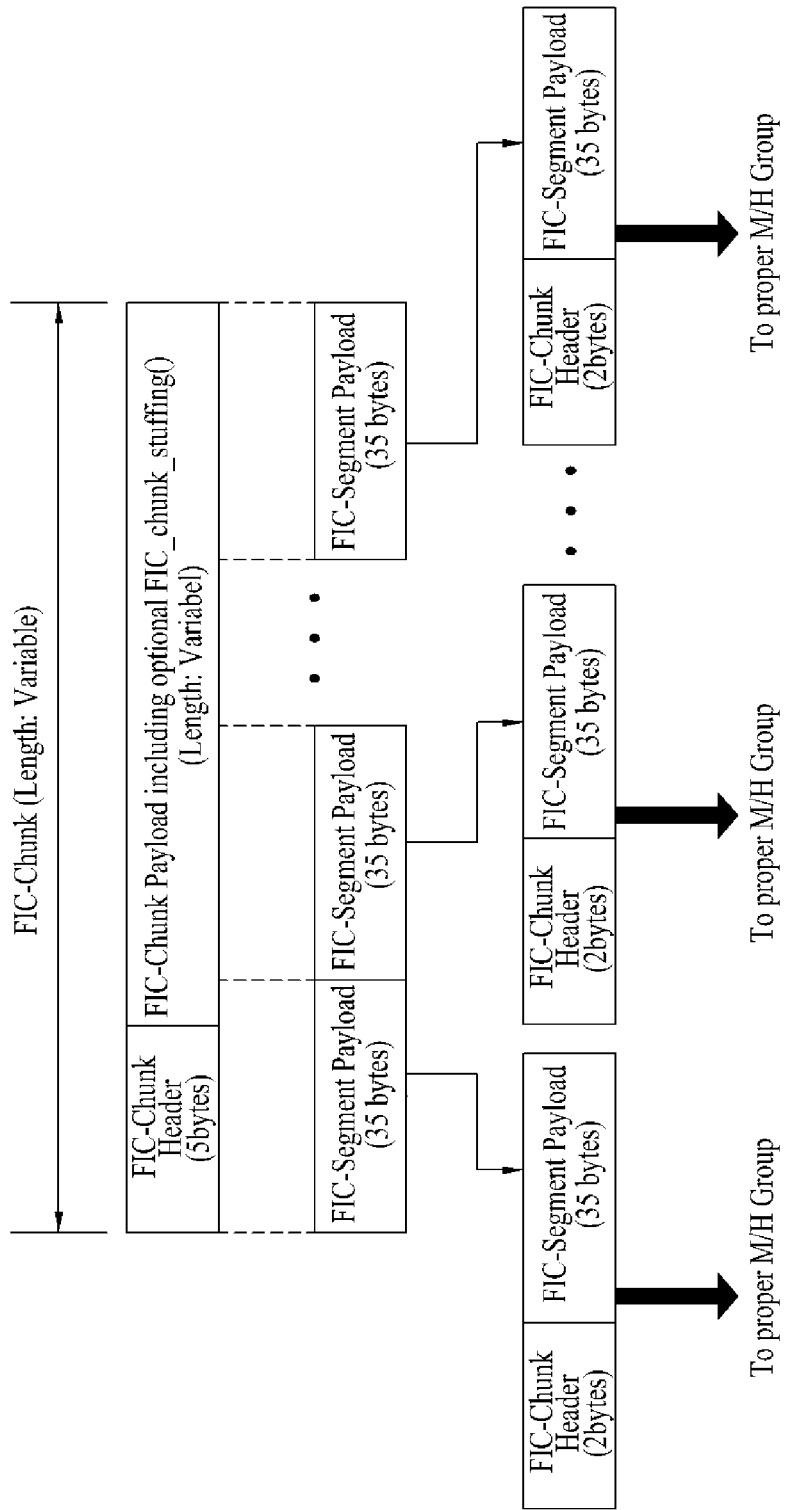
FIG. 21 illustrates mapping of an FIC chunk to an FIC segment delivery unit according to an embodiment of the present invention.

FIG. 21 illustrates mapping of an FIC chunk to an FIC segment delivery unit according to an embodiment of the present invention.

Within an M/H Frame, the total number of FIC-Segments is equal to (TNoG*5), which provides (37*TNoG*5) bytes for FIC-Chunk delivery. Each FIC-Segment has a two-byte header and 35 bytes for payload.

Each FIC-Chunk instance to be transmitted shall be divided into a number of delivery units of size 35 bytes in length. The number of delivery units is determined by the size of the FIC-Chunk instance, which in turn is determined by the number of M/H Ensembles and the number of M/H Services present in the M/H Broadcast. Each delivery unit shall be packed into an FIC-Segment for transmission.

FIG. 22 illustrates an exemplary syntax structure of an FIC segment header according to an embodiment of the present invention.

Herein, the FIC segment header may include a FIC_segment_type field, an FIC_chunk_major_protocol_version field, a current_next_indicator field, an error_indicator field, an FIC_segment_num field, and an FIC_last_segment_num field. Each field will now be described as follows.

The FIC_segment_type field corresponds to a 2-bit field, which, when set to '00' indicates that the corresponding FIC segment is carrying a portion of an FIC chunk. Alternatively, when the FIC_segment_type field is set to '11', the FIC_segment_type field indicates that the corresponding FIC segment is a null FIC segment, which transmits stuffing data. Herein, the remaining values are reserved for future use.

The FIC_Chunk_major_protocol_version field corresponds to a 2-bit field, which indicates a major protocol version of the corresponding FIC chunk. At this point, the value of the FIC_Chunk_major_protocol_version field should be the same as the value of the FIC_major_protocol_version field within the corresponding FIC chunk header. Since reference may be made to the description of the FIC chunk header shown in FIG. 19, a detailed description of the major protocol version of the FIC chunk syntax will be omitted for simplicity.

The current_next_indicator field corresponds to a 1-bit indicator, which, when set to '1', shall indicate that the corresponding FIC segment is carrying a portion of the FIC chunk, which is applicable to the current M/H frame. Alternatively, when the value of the current_next_indicator field is set to '0', the current_next_indicator field shall indicate that the corresponding FIC segment is carrying a portion of the FIC chunk, which will be applicable for the next M/H frame.

The error_indicator field corresponds to a 1-bit field, which indicates whether or not an error has occurred in the corresponding FIC segment during transmission. Herein, the error_indicator field is set to '1', when an error has occurred. And, the error_indicator field is set to '0', when an error does not exist (or has not occurred). More specifically, during the process of configuring the FIC segment, when a non-recovered error exists, the error_indicator field is set to T. More specifically, the error_indicator field enables the receiving system to recognize the existence (or presence) of an error within the corresponding FIC segment.

The FIC_segment_num field corresponds to a 4-bit unsigned integer number field, which indicates a number of the corresponding FIC segment. For example, if the corresponding FIC segment is the first FIC segment of the FIC chunk, the value of the FIC_segment_num field shall be set to '0x0'. Also, if the corresponding FIC segment is the second FIC segment of the FIC chunk, the value of the FIC_segment_num field shall be set to '0x1'. More specifically, the FIC_segment_num field shall be incremented by one with each additional FIC segment in the FIC chunk. Herein, if the FIC chunk is divided into 4 FIC segments, the FIC_segment_num field value of the last FIC segment within the FIC chunk will be indicated as '0x3'.

The FIC_last_segment_num field corresponds to a 4-bit unsigned integer number field, which indicates the number of the last FIC segment (i.e., the FIC segment having the highest FIC_segment_num field value) within a complete FIC chunk.

In the conventional method, FIC segment numbers are sequentially assigned (or allocated) for each FIC segment within one sub-frame. Therefore, in this case, the last FIC segment number always matches with the TNoG (i.e., the last FIC segment number is always equal to the TNoG). However, when using the FIC number assignment method according to the present invention, the last FIC segment number may not always match with the TNoG. More specifically, the last FIC segment number may match with the TNoG, or the last FIC segment number may not match with the TNoG. The TNoG represents a total number of data groups that are allocated (or assigned) to a single sub-frame. For example, when the TNoG is equal to '6', and when the FIC chunk is divided into 8 FIC segments, the TNoG is equal to '6', and the last FIC segment number is '8'.

According to another embodiment of the present invention, the null FIC segment may be identified by using the value of the FIC_segment_num field within the FIC segment header. More specifically, since an FIC segment number is not assigned to the null FIC segment, the transmitting system allocates null data to the FIC_segment_num field value of the null FIC segment, and the receiving system may allow the FIC segment having null data assigned to the FIC_segment_num field value to be recognized as the null FIC segment. Herein, instead of the null data, data pre-arranged by the receiving system and the transmitting system may be assigned to the FIC_segment_num field value, instead of the null data.

As described above, the FIC chunk is divided into a plurality of FIC segments, thereby being transmitted through a single sub-frame or being transmitted through multiple sub-frames. Also, FIC segments divided from a single FIC chunk may be transmitted through a single sub-frame, or FIC segments divided from multiple single FIC chunks may be transmitted through a single sub-frame. At this point, the number assigned to each FIC segment corresponds to a number within the corresponding FIC chunk (i.e., the FIC_seg_number value), and not the number within the corresponding sub-frame. Also, the null FIC segment may be transmitted for aligning the boundary of the M/H frame and the boundary of the FIC chunk. At this point, an FIC segment number is not assigned to the null FIC segment.

As described above, one FIC chunk may be transmitted through multiple sub-frames, or multiple FIC chunks may be transmitted through a single sub-frame. However, according to the embodiment of the present invention, the FIC segments are interleaved and transmitted in sub-frame units.

Figure 23:
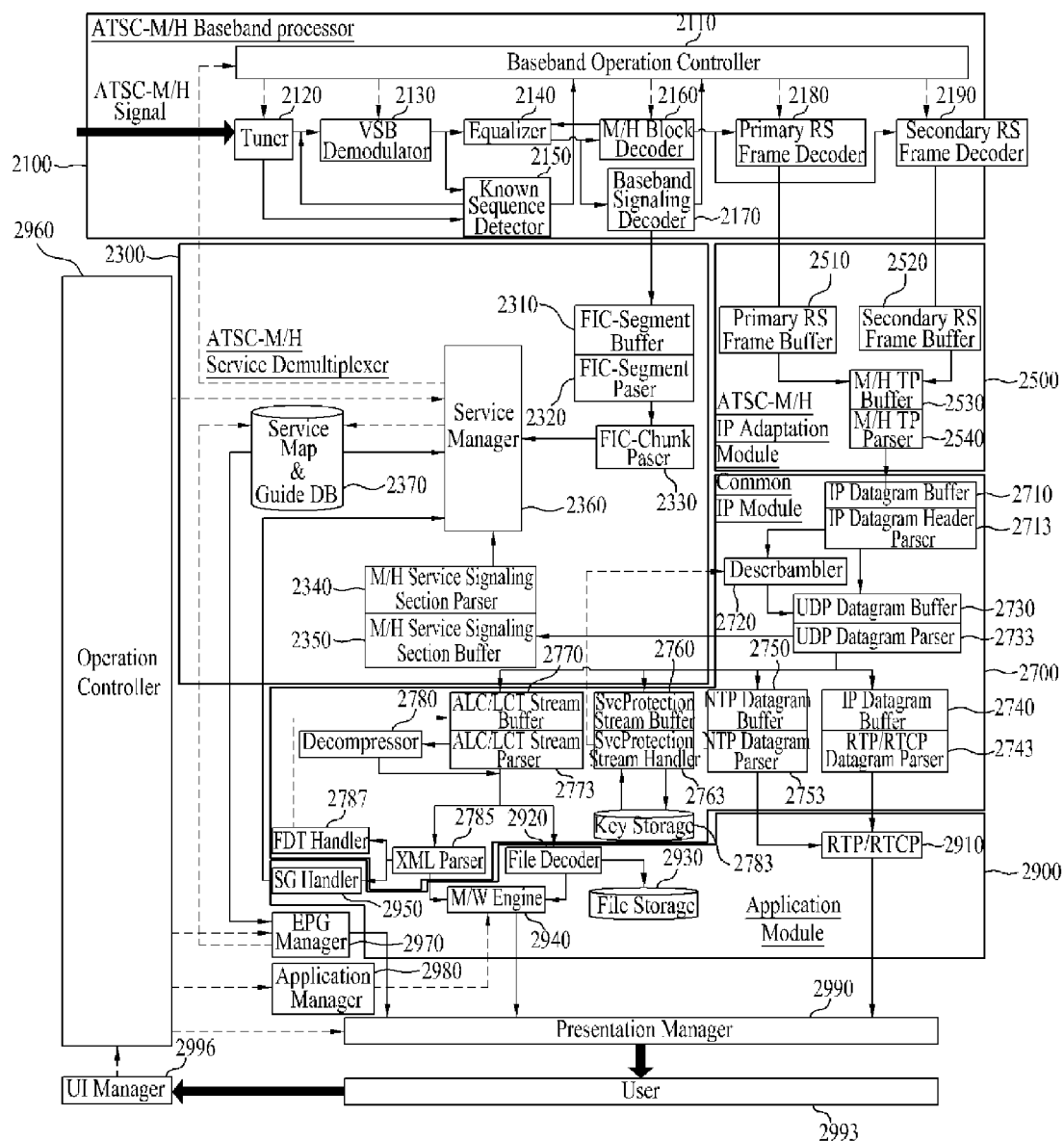
FIG. 23 is a block diagram of a digital broadcast receiver according to an embodiment of the present invention.

FIG. 23 is a block diagram of a digital broadcast receiver according to an embodiment of the present invention.

The digital broadcast receiver includes an ATSC-M/H baseband processor 2100, an ATSC-MH service demultiplexer 2300, an ATSC-MH IP adaptation module 2500, a common IP module 2700, and an application module 2900. The digital broadcast receiver may also include an operation controller 2960, an EPG manager 2970, an application manager 2980, a presentation manager 2990, and a UI manager 2996.

The ATSC-M/H baseband processor 2100 includes a baseband operation controller 2110, a tuner 2120, a demodulator 2130, an equalizer 2140, a known sequence detector 2150, a block decoder 2160, a baseband signaling decoder 2170, a primary RS frame decoder 2180, and a secondary RS frame decoder 2190.

The baseband operation controller 2110 controls the overall operation of the baseband module of the receiver. In an embodiment, all components of the ATSC-M/H baseband processor 2100 are controlled by the baseband operation controller 2110.

The tuner 2120 functions to tune the receiver to a specific frequency signal carrying a digital broadcast signal. The tuner 2120 down-converts the received frequency signal into an Intermediate Frequency (IF) signal and outputs the IF signal to the demodulator 2130 and the known sequence detector 2150.

The demodulator 2130 performs automatic gain control, carrier restoration, timing restoration, and the like on a digital IF signal of the pass band input from the tuner 2120 to create a baseband signal and then outputs the baseband signal to the equalizer 2140 and the known sequence detector 2150. The demodulator 2130 may perform timing restoration or carrier restoration using a symbol sequence of known data input from the known sequence detector 2150. That is, the demodulator 2130 may demodulate broadcast data using a demodulation result of data known to the receiver, thereby increasing demodulation performance.

The equalizer 2140 receives the demodulated signal from the demodulator 2130 and compensates for channel distortion that has occurred during transmission and then outputs the resulting signal to the block decoder 2160. The equalizer 2140 may use a known data symbol sequence input from the known sequence detector 2150 to improve equalization performance. The equalizer 2140 may also receive feedback of the decoding result to improve equalization performance.

The known sequence detector 2150 receives data input to and output from the demodulator 2130, i.e., data that has not demodulated or data that has been partially demodulated and detects the position of known data inserted by the transmitting side. The known sequence detector 2150 outputs a known data sequence decoded at the detected position of the known data, together with the detected position information of the known data, to the demodulator 2130 and the equalizer 2140. The known sequence detector 2150 may output information, which enables the block decoder 2160 to distinguish mobile service data that was subjected to additional encoding at the transmitting side and data that was not subjected to additional encoding at the transmitting side, to the block decoder 2160.

The block decoder 2160 performs the reverse processes of block encoding and trellis encoding, i.e., block decoding and trellis decoding, on the input channel-equalized data input from the equalizer 2140 when the input channel-equalized data is data (i.e., data in an RS frame or signaling data) that was subjected to block encoding and trellis encoding at the transmitting side. The block decoder 2160 performs only trellis decoding on the input channel-equalized data input from the equalizer 2140 when the input channel-equalized data is data (i.e., main service data) that was subjected to trellis encoding but was not subjected to block encoding at the transmitting side.

The baseband signaling decoder 2170 decodes signaling data that was subjected to both block encoding and trellis encoding when the signaling data is input to the baseband signaling decoder 2170 after being channel-equalized by the equalizer 214. Here, the decoded signaling data includes a transmission parameter. In an embodiment of the present invention, the signaling data may be Transmission Parameter Channel (TPC) data. Transmission parameters included in the signaling data may include information indicating whether or not TPC data has been changed (for example, updated), information indicating whether the digital broadcast signal has been transmitted in an SFCMM or in a CMM, information indicating the number of mobile service data packets that are additionally included in one data group, and information indicating whether or not data blocks included in each of adjacent data groups constitute one SCCC block.

The primary RS frame decoder 2180 receives only RS-encoded and/or CRC-encoded mobile service data among data output from the block decoder 2160. The primary RS frame decoder 2180 performs the inverse of the process of the RS frame encoder in the transmission system. The primary RS frame decoder 2180 also corrects errors in the RS frame and combines a number of error-corrected data groups to create an RS frame. That is, the primary RS frame decoder 2180 decodes a primary RS frame including data for actual broadcast service.

The secondary RS frame decoder 2190 receives only RS-encoded and/or CRC-encoded mobile service data among data output from the block decoder 2160. The secondary RS frame decoder 2190 performs the inverse of the process of the RS frame encoder in the transmission system. The secondary RS frame decoder 2190 also corrects errors in the RS frame and combines a number of error-corrected data groups to create an RS frame. That is, the secondary RS frame decoder 2190 decodes a primary RS frame including additional data for broadcast service. Although the primary RS frame decoder 2180 and the secondary RS frame decoder 2190 are separately illustrated, both the primary RS frame decoder 2180 and the secondary RS frame decoder 2190 may be included in an RS frame decoder which can separately perform primary RS frame decoding and secondary RS frame decoding.

The ATSC-MH service demultiplexer 2300 includes an FIC segment buffer 2310, an FIC segment parser 2320, an FIC chunk parser 2330, an M/H service signaling section parser 2340, an M/H service signaling section buffer 2350, a service manager 2360, and a service map/guide DB 2370.

The FIC segment buffer 2310 serves to buffer an FIC-segment group in a de-interleaved and RS-decoded M/H subframe received from the baseband signaling decoder 2170.

The FIC segment parser 2320 serves to extract, analyze, and process a header of each FIC segment stored in the FIC segment buffer 2310. The CMM receiver ignores an SFCMM related field through an FIC_chunk_major_protocol_version or FIC_chunk_minor_protocol_version value included in the header of the FIC segment obtained in this process. The CMM receiver also skips an added field in the header through an FIC_chunk_header_extension_length included in the header of the FIC segment.

The FIC chunk parser 2330 serves to restore and analyze/process an FIC chunk data structure in FIC segments analyzed by the FIC Segment Parser 2320.

The M/H service signaling section parser 2340 serves to analyze/process table sections of an M/H service signaling channel transmitted through a UDP/IP stream.

The M/H service signaling section buffer 2350 buffers table sections of an M/H service signaling channel to be processed by the M/H service signaling section parser 2340.

The service manager 2360 constructs a service map signaling data collected from the FIC chunk parser 2330 and the M/H service signaling section parser 2340 and creates a program guide using a service guide. The service manager 2360 also serves to control the baseband operation controller 2110 so as to receive a desired M/H service according to a user input and to allow a program guide to be displayed according to a user input.

The service map/guide DB 2370 serves to store the service map and the service guide created by the service manager 2360 and to extract and transfer service related data required for each component to the component according to inputs from the service manager 2360 and the EPG manager 2970.

The ATSC-MH IP adaptation module 2500 includes a primary RS frame buffer 2510, a secondary RS frame buffer 2520, an M/H Transport stream Packet (TP) buffer 2530, and an M/H TP parser 2540.

The primary RS frame buffer 2510 serves to buffer an RS frame received from the primary RS frame decoder 2180 and to transfer each received RS frame row by row to the M/H TP buffer 2530.

The secondary RS frame buffer 2520 serves to buffer an RS frame received from the secondary RS frame decoder 2190 and to transfer each received RS frame row by row to the M/H TP buffer 2530. The primary RS frame buffer 2510 and the secondary RS frame buffer 2520 may be physically constructed as one buffer.

The M/H TP buffer 2530 serves to extract and buffer an M/H TP corresponding to each row of the RS frame.

The M/H TP parser 2540 serves to analyze a header corresponding to the first 2 bytes to restore an IP datagram.

The common IP module 2700 includes an IP datagram buffer 2710, an IP datagram header parser 2713, a descrambler 2720, a UDP datagram buffer 2730, a UDP datagram parser 2733, an RTP/RTCP datagram buffer 2740, an RTP/RTCP datagram parser 2743, an NTP datagram buffer 2750, an NTP datagram parser 2753, a SvcProtection stream buffer 2760, a SvcProtection stream handler 2763, an ALV/LCT stream buffer 2770, an ALV/LCT stream parser 2773, a decompressor 2780, a key storage 2783, an XML parser 2785, and an FDT handler 2787.

The IP datagram buffer 2710 buffers an encapsulated IP datagram received through the M/H TP.

The IP datagram header parser 2713 restores IP datagrams and analyzes a header of each datagram. In an embodiment, the operation of the IP datagram header parser 2713 is performed through the service manager 2360.

The descrambler 2720 functions to descramble data of a scrambled payload included in the received IP datagram using an encryption key received from the SvcProtection stream handler 2763.

The UDP datagram buffer 2730 serves to buffer a UDP datagram received through the IP datagram.

The UDP datagram parser 2733 functions to restore the UDP datagram and to analyze and process a restored UDP header.

The RTP/RTCP datagram buffer 2740 buffers a datagram of an RTP/RTCP stream received through a UDP/IP stream.

The RTP/RTCP datagram parser 2743 serves to restore, analyze, and process a datagram of an RTP/RTCP stream.

The NTP datagram buffer 2750 buffers a datagram of a network time protocol stream received through a UDP/IP stream.

The NTP datagram parser 2753 serves to restore, analyze, and process a datagram of a network time protocol stream.

The SvcProtection stream buffer 2760 buffers data, such as a key value for descrambling required for a service protection function, received through a UDP/IP stream.

The SvcProtection stream handler 2763 processes data such as a key value for descrambling required for the service protection function. Data output from the SvcProtection stream handler 2763 is transferred to the descrambler 2720.

The ALV/LCT stream buffer 2770 buffers ALC/LCT data received through a UDP/IP stream.

The ALV/LCT stream parser 2773 functions to restore ALC/LCT data received through a UDP/IP stream and to analyze a header and a header extension of the ALC/LCT data.

When the decompressor 2780 receives a compressed file, the decompressor 2780 performs a process for decompressing the file.

The key storage 2783 stores a key message used for the service protection function that has been restored by the SvcProtection stream handler.

The XML parser 2785 serves to analyze an XML document received through an ALC/LCT session and to transfer the analyzed data to appropriate modules such as the FDT handler 2787 and the SG handler 2950.

The FDT handler 2787 analyzes and processes a file description table received through an ALC/LCT session.

The application module 2900 includes an A/V decoder 2910, a file decoder 2920, a file storage 2930, an M/W engine 2940, and a Service Guide (SG) handler 2950.

The A/V decoder 2910 functions to decode compressed audio/video data received through the RTP/RTCP datagram Parser 2743 and to process the decoded data for presentation to the user.

The file decoder 2920 functions to decode the file restored by the ALV/LCT stream parser 2773.

The file storage 2930 functions to store the file decoded by the file decoder 2920 and to provide the file to another module when needed.

The M/W engine 2940 processes data such as a file received through a FLUTE session or the like and provides the data to the presentation manager 2990.

The Service Guide (SG) handler 2950 performs a process for collecting and analyzing service guide data received in an XML document format and providing the service guide data to the EPG manager 2970.

The operation controller 2960 performs an operation for processing a user command received through a UI Manager 2996 and performs a management operation to enable a manger of each module, required during the procedure for processing the command, to perform a corresponding action.

The EPG manager 2970 performs a management operation to enable a corresponding EPG to be displayed according to user input using EPG data received through the service guide handler 2950.

The application manager 2980 performs overall management associated with processing of application data received in the form of an object, a file, or the like.

The presentation manager 2990 processes data received from the A/V decoder 2910, the M/W engine 2940, the EPG manager 2950, and the like to enable presentation of the service to the user. This process may be performed under control of the operation controller 2960.

The UI manager 2996 transfers a user input received through the user interface to the operation controller 2960 and performs a management operation to start a process for a service required by the user.

The names of the modules of the receiver described above may be changed. Specific modules may be omitted or added depending on the system.

Figure 24:
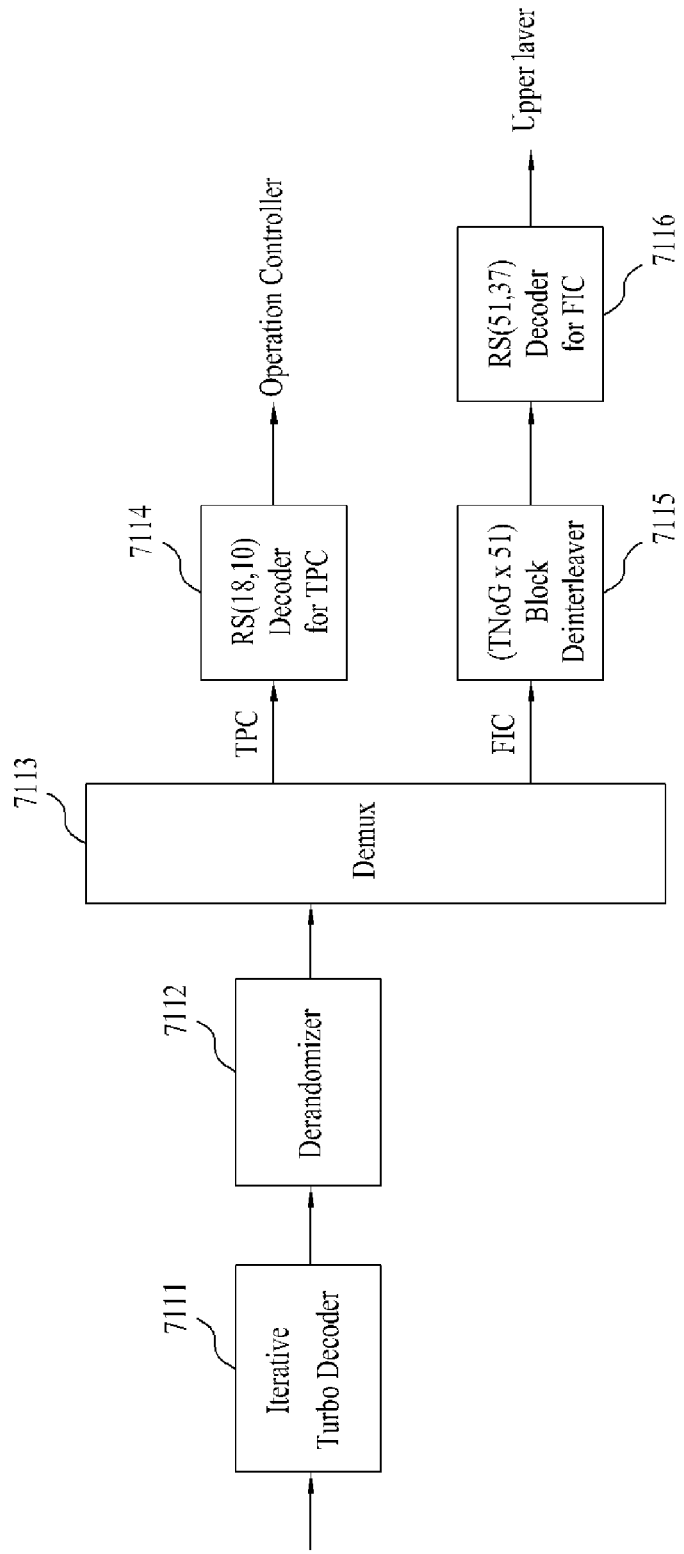
FIG. 24 illustrates a block view of the signaling decoder according to an embodiment of the present invention.

FIG. 24 illustrates a block view of the signaling decoder according to an embodiment of the present invention. The signaling decoder performs iterative turbo decoding and RS-decoding on the data of the signaling information region among the equalized data. Thereafter, the transmission parameter (i.e., TPC data) obtained as a result of the above-described process is outputted to the baseband operation controller, and the FIC data are outputted to an upper layer.

For this operation, the signaling decoder may include an iterative turbo decoder 7111, a derandomizer 7112, a demultiplexer 7113, an RS decoder 7114, a block deinterleaver 7115, and an RS decoder 7116.

Figure 25:
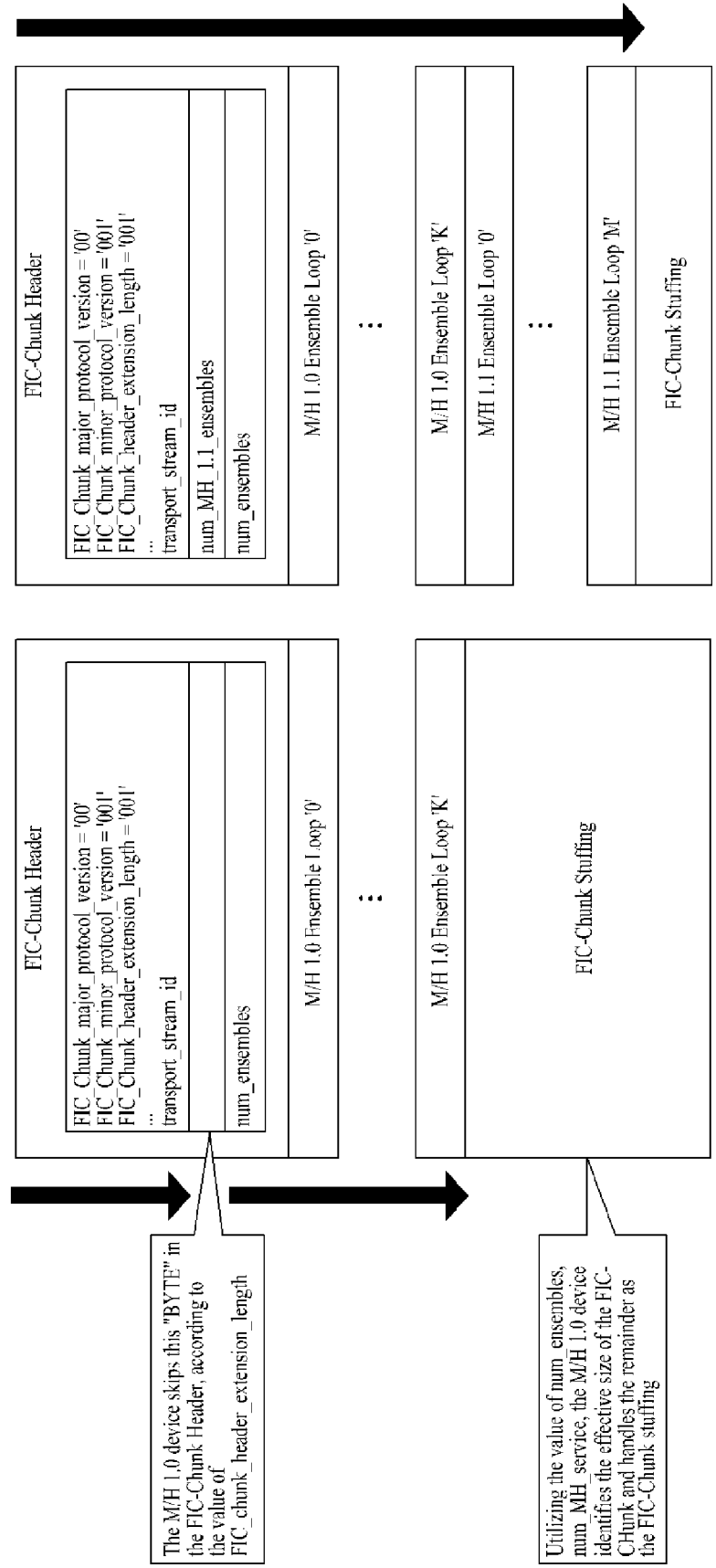
FIG. 25 illustrates a method in which a CMM receiver and an SFCMM receiver process data according to FIC header information according to an embodiment of the present invention.

FIG. 25 illustrates a method in which a CMM receiver and an SFCMM receiver process data according to FIC header information according to an embodiment of the present invention.

SFCMM may be expressed as MH 1.1 and CMM may be expressed as MH 1.0 for ease of explanation.

As shown in FIG. 25(*a*), when a CMM receiver parses an FIC header having an extended field, the CMM receiver determines, through an FIC_chunk_minor_protocol_version value, that an extension for a signaling structure for an SFCMM is present in the FIC. Using such minor protocol versioning, the CMM ignores a portion for SFCMM ensemble/service in the FIC data structure. Through this operation, it is possible to prevent malfunction due to presence of extended data. More specifically, the CMM receiver determines that an extended field is present in the FIC header through the FIC_chunk_header_extension_length value and thus skips a num_MH1.1_ensembles field. Accordingly, the CMM receiver reads only the num_ensembles field and thus performs processing only on a loop for MH1.0 ensemble in an FIC payload. In an embodiment, since the CMM receiver has skipped the num_MH1.1_ensembles field, a loop for an MH1.1 ensemble is not a field expected by the CMM receiver and thus is processed as stuffing data. As a result, the CMM receiver skips all SFCMM ensemble loops.

As shown in FIG. 25(*b*), when an SFCMM receiver parses an FIC header having an extended field, the SFCMM receiver determines, through an FIC_chunk_minor_protocol_version value, that an extension for a signaling structure for an SFCMM is present in the FIC. The SFCMM receiver then determines that an extended field is present in the FIC header through the FIC_chunk_header_extension_length value and thus reads a num_MH1.1_ensembles field. The SFCMM receiver processes an MH1.0 ensemble loop indicated by num_ensembles and processes an MH1.1 ensemble loop indicated by num_MH1.1_ensembles.

Figure 26:
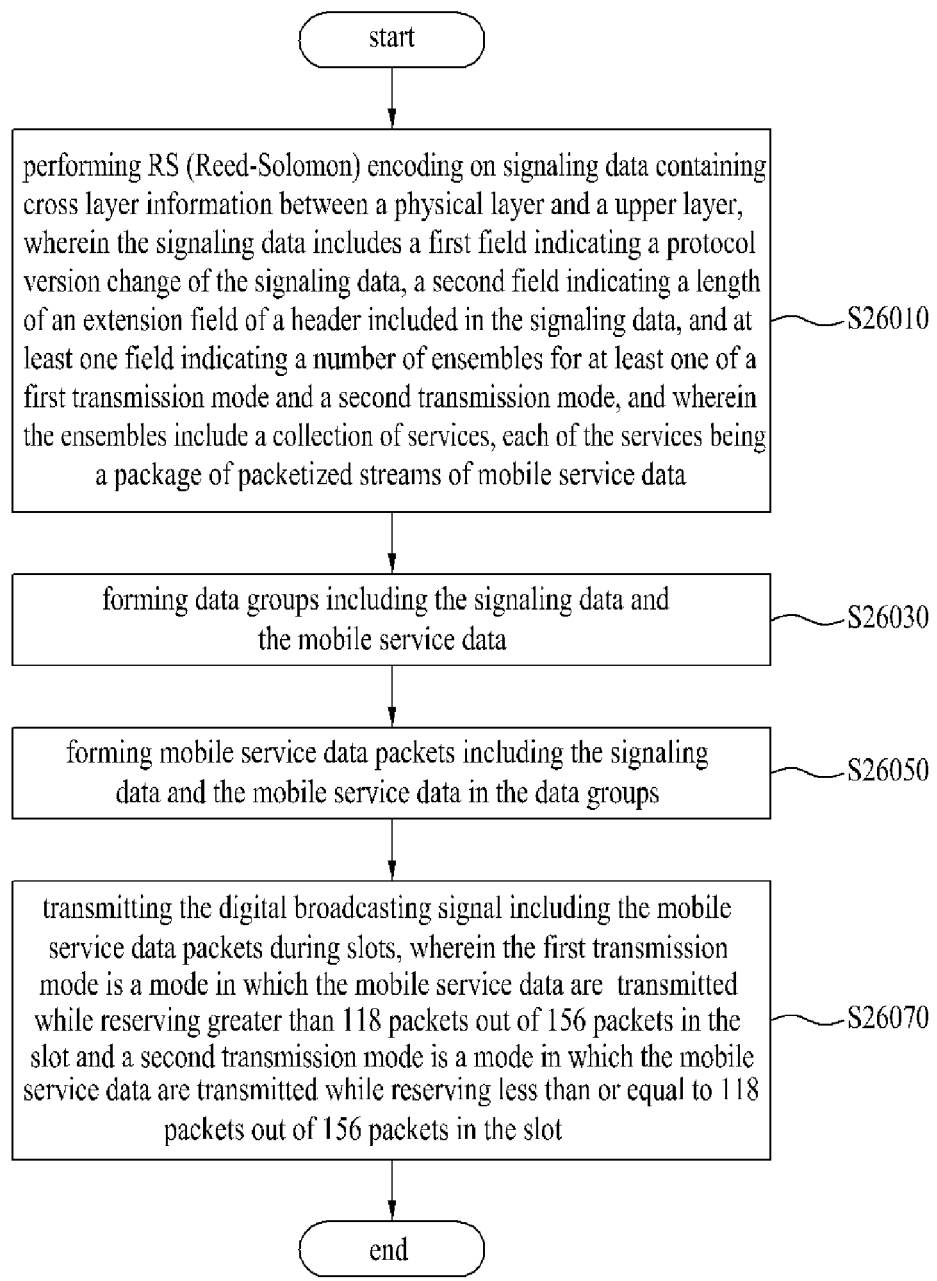
FIG. 26 illustrates a method for processing a digital broadcast signal at the transmitting side according to an embodiment of the present invention.

FIG. 26 illustrates a method for processing a digital broadcast signal at the transmitting side according to an embodiment of the present invention.

The digital broadcast transmitting side generates signaling data for mobile service signaling and performs RS encoding on the signaling data (S26010). Here, in an embodiment of the present invention, the generated and RS-encoded signaling data is cross-layer information for connection between the physical layer and the upper layers. The signaling data may include information indicating the number of SFCMM ensembles. This information allows the receiving side to determine the number of SFCMM ensembles and to process the same number of SFCMM ensemble loops as the number of SFCMM ensembles included in an FIC payload.

The signaling data may include information indicating whether or not an extension having a signaling data structure is present, information indicating whether or not the extension having a signaling data structure is backwards compatible, information indicating the length of an added field in the extended signaling data structure, and the like.

The transmitting side creates data groups to be transmitted by inserting RS-encoded signaling data and mobile service data for providing a mobile service into the data groups (S26030). Details of the data groups to be transmitted are similar to those described above with reference to FIGS. 12 and 13.

The transmitting side converts the signaling data and the mobile service data included in the data groups into mobile service data packets (S26050). The mobile service data packets include data items used for the mobile service in addition to the signaling data and the mobile service data.

The transmitting side transmits a digital broadcast signal including the data groups including the signaling data and the mobile service data (S26070).

The signaling data includes signaling information according to the SFCMM and the CMM. Here, the SFCMM is a mode in which more than 118 packets among 156 packets included in one slot are used to transmit mobile service data and the CMM is a mode in which 118 or fewer packets among 156 packets included in one slot are used to transmit mobile service data. In an embodiment of the present invention, packets that are not used for mobile service data among 156 packets included in one slot are used for main service data. That is, the number of main service data packets included in one slot may vary according to whether the mode is SFCMM or CMM.

The SFCMM may flexibly transmit a larger number of mobile service data packets than the CMM as needed. Accordingly, it is possible to achieve a flexible mobile service.

Figure 27:
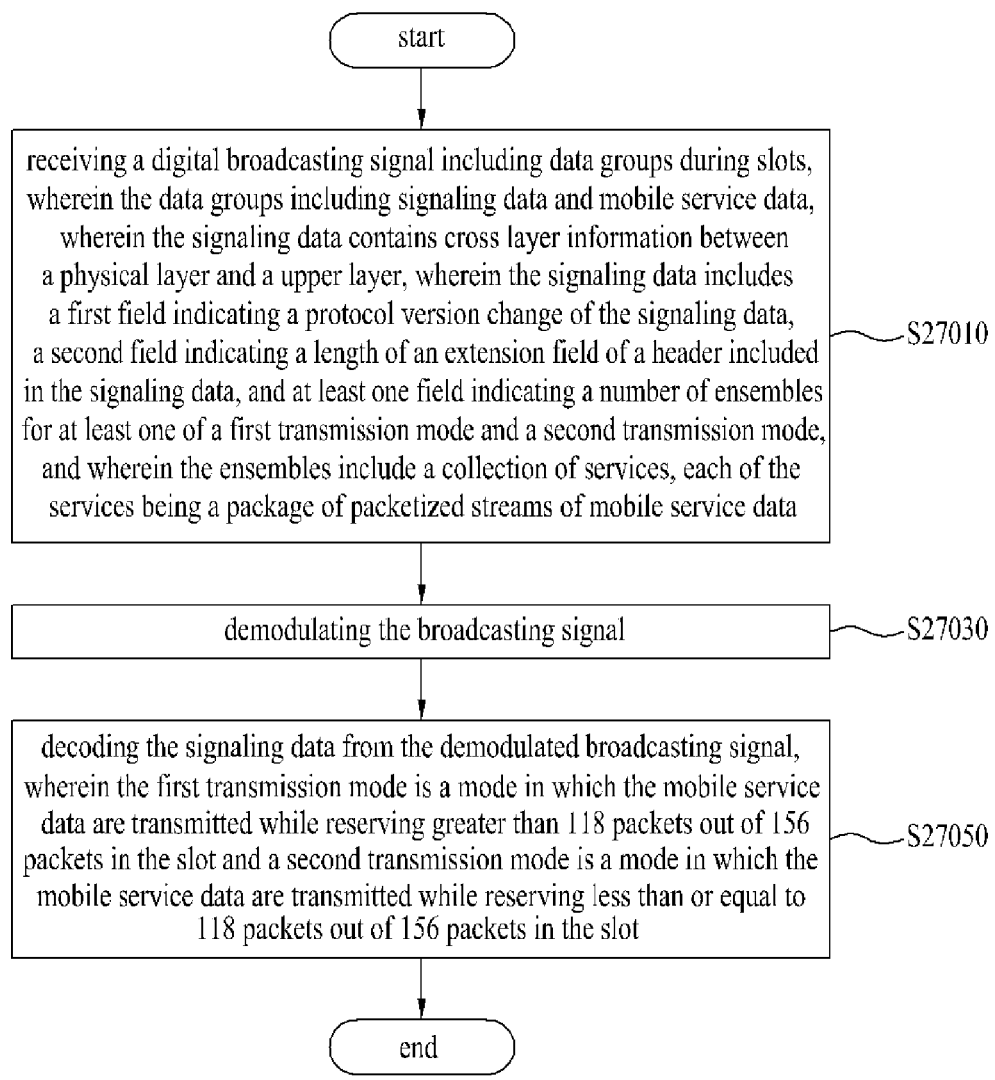
FIG. 27 illustrates a method for processing a digital broadcast signal at the receiving side according to an embodiment of the present invention.

FIG. 27 illustrates a method for processing a digital broadcast signal at the receiving side according to an embodiment of the present invention.

The receiver receives a digital broadcast signal including data groups including signaling data and mobile service data (S7010). Here, in an embodiment of the present invention, the signaling data is cross-layer information for connection between the physical layer and the upper layers. The signaling data may include information indicating the number of SFCMM ensembles. This information allows the receiving side to determine the number of SFCMM ensembles and to process the same number of SFCMM ensemble loops as the number of SFCMM ensembles included in an FIC payload.

The signaling data may include information indicating whether or not an extension having a signaling data structure is present, information indicating whether or not the extension having a signaling data structure is backwards compatible, information indicating the length of an added field in the extended signaling data structure, and the like.

The receiver performs demodulation on the received digital broadcast signal (S27030). For a more detailed description of this process, refer to the above description of the baseband processor with reference to FIG. 23.

The receiver decodes signaling data included in the demodulated digital broadcast signal (S27050). This signaling data provides the receiver with information regarding ensembles including a specific mobile service to allow the receiver to process specific mobile service data among the mobile service data.

For details of information items included in the signaling data, refer to the above description of FIGS. 19 and 20. The information items included in the signaling data are used in a procedure in which the receiver identifies and decodes mobile service data associated with a specific mobile service included in a digital broadcast signal in order to provide the specific mobile service to the user.

As described above, the transmitting system, the receiving system, and the method of processing broadcast signals according to the present invention have the following advantages.

When transmitting mobile service data through a channel, the present invention may be robust against errors and backward compatible with the conventional digital broadcast receiving system.

This invention extends a region for mobile service data in a slot. Thus, the transmitter can transmit more mobile service data.

This invention has an advantage enhancing the reception performance of a broadcast signal at a reception system, and a method for processing a broadcast signal by inserting additional known data in regions C, D and E.

The present invention is even more effective when applied to mobile and portable receivers, which are also liable to a frequent change in channel and which require protection (or resistance) against intense noise.

According to this invention, through extended FIC data, a receiver can appropriately process service data transmitted in the SFCMM and in the CMM. This invention provides a signaling method that allows SFCMM data to be processed through an extension of the FIC.

This invention also provides a method that allows a CMM receiver, which cannot read SFCMM data, to receive and process an extended FIC. Thus, there is no need to generate and transmit respective FIC data for the SFCMM and the CMM and it is possible to use FIC data having the same structure for signaling of SFCMM and CMM data.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed:

1. A method of processing a digital broadcasting signal in a transmitter, the method comprising,
   performing RS (Reed-Solomon) encoding on signaling data containing cross layer information between a physical layer and a upper layer;
   interleaving the RS encoded signaling data, wherein the interleaving the RS encoded signaling data comprises:
      writing the RS encoded signaling data row-by-row from left to right and top-to-bottom in a signaling data block; and
      outputting the signaling data in the signaling data block by reading column by column from top-to-bottom and left-to-right,
   wherein the signaling data includes a first field indicating a protocol version change of the signaling data, a second field indicating a length of an extension field of a header included in the signaling data, a first transmission ensemble number field indicating a number of ensembles for a first transmission mode, and a second transmission ensemble number field indicating a number of ensembles for a second transmission mode, and wherein the ensembles include a collection of services, each of the services being a package of packetized streams of mobile service data;
   transmitting the digital broadcasting signal including the mobile service data and the interleaved signaling data during slots,
   wherein the first transmission mode is a mode in which the mobile service data are transmitted while reserving greater than 118 packets out of 156 packets in a slot and the second transmission mode is a mode in which the mobile service data are transmitted while reserving less than or equal to 118 packets out of 156 packets in the slot,
   wherein the second field is also used to skip the first transmission ensemble number field by a receiver for the second transmission mode.

2. The method of claim 1,
   wherein the signaling data further includes the header and a payload, and
   wherein the first field, second field, first transmission ensemble number field and second transmission ensemble number field are included in the header.

3. The method of claim 2, wherein the payload includes a first transmission mode service number field indicating a number of services included in an ensemble for the first transmission mode, and a second transmission mode service number field indicating a number of services included in an ensemble for the second transmission mode.

4. The method of claim 3, wherein the second transmission ensemble number field and the second transmission mode service number field are used by the receiver for the second transmission mode to identify effective size of the signaling data that is applicable to the receiver for the second transmission mode.

5. The method of claim 4, wherein the second transmission mode service number field is treated as stuffing in the signaling data by the receiver for the second transmission mode.

6. A transmitter for transmitting a digital broadcasting signal, the transmitter comprising:
   an encoder configured to perform RS (Reed-Solomon) encoding on signaling data containing cross layer information between a physical layer and a upper layer;

a signaling interleaver configured to interleave the RS encoded signaling data, wherein the signaling interleaver is further configured to:
- write the RS encoded signaling data row-by-row from left to right and top-to-bottom in a signaling data block; and
- output the signaling data in the signaling data block by reading column by column from top-to-bottom and left-to-right, wherein the signaling data includes a first field indicating a protocol version change of the signaling data, a second field indicating a length of an extension field of a header included in the signaling data, a first transmission ensemble number field indicating a number of ensembles for a first transmission mode, and a second transmission ensemble number field indicating a number of ensembles for a second transmission mode, and wherein the ensembles include a collection of services, each of the services being a package of packetized streams of mobile service data;

a transmission unit configured to transmit the digital broadcasting signal including the mobile service data and the interleaved signaling data during slots, wherein the first transmission mode is a mode in which the mobile service data are transmitted while reserving greater than 118 packets out of 156 packets in a slot and the second transmission mode is a mode in which the mobile service data are transmitted while reserving less than or equal to 118 packets out of 156 packets in the slot, wherein the second field is also used to skip the first transmission ensemble number field by a receiver for the second transmission mode.

7. The transmitter of claim 6,
wherein the signaling data further includes the header and a payload, and
wherein the first field, second field, first transmission ensemble number field and second transmission ensemble number field are included in the header.

8. The transmitter of claim 7, wherein the payload includes a first transmission mode service number field indicating a number of services included in an ensemble for the first transmission mode, and a second transmission mode service number field indicating a number of services included in an ensemble for the second transmission mode.

9. The transmitter of claim 8, wherein the second transmission ensemble number field and the second transmission mode service number field are used by the receiver for the second transmission mode to identify effective size of the signaling data that is applicable to the receiver for the second transmission mode.

10. The transmitter of claim 9, wherein the second transmission mode service number field is treated as stuffing in the signaling data by the receiver for the second transmission mode.

* * * * *